(12) United States Patent
Song

(10) Patent No.: US 9,190,131 B2
(45) Date of Patent: Nov. 17, 2015

(54) MEMORY AND MEMORY SYSTEM INCLUDING THE SAME

(71) Applicant: SK hynix Inc., Gyeonggi-do (KR)

(72) Inventor: Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 171 days.

(21) Appl. No.: 14/085,478

(22) Filed: Nov. 20, 2013

(65) Prior Publication Data
US 2014/0177376 A1    Jun. 26, 2014

(30) Foreign Application Priority Data

Dec. 20, 2012  (KR) ........................ 10-2012-0149944
Dec. 20, 2012  (KR) ........................ 10-2012-0149967

(51) Int. Cl.
| *G11C 8/08* | (2006.01) |
| *G11C 29/00* | (2006.01) |
| *G11C 11/406* | (2006.01) |
| *G11C 11/408* | (2006.01) |

(52) U.S. Cl.
CPC ................ *G11C 8/08* (2013.01); *G11C 11/406* (2013.01); *G11C 11/4087* (2013.01); *G11C 29/783* (2013.01)

(58) Field of Classification Search
CPC ...... G11C 8/08; G11C 29/783; G11C 11/406; G11C 11/4087
USPC ............................................. 365/230.03, 200
See application file for complete search history.

(56) References Cited

U.S. PATENT DOCUMENTS

| 6,212,118 | B1 * | 4/2001 | Fujita ................... G11C 11/406 365/200 |
| 7,139,216 | B2 * | 11/2006 | Higashi .............. G11C 11/4085 365/182 |
| 7,352,642 | B2 * | 4/2008 | Ohsawa ............... G11C 11/406 365/182 |
| 7,499,331 | B2 * | 3/2009 | Ohsawa ............... G11C 11/404 365/177 |
| 7,626,879 | B2 * | 12/2009 | Ohsawa ................... G11C 8/04 365/149 |
| 9,032,141 | B2 * | 5/2015 | Bains ................. G11C 11/4078 711/106 |
| 2014/0078845 | A1 * | 3/2014 | Song ........................ G11C 7/02 365/222 |
| 2014/0334224 | A1 * | 11/2014 | Cordero ............... G11C 11/406 365/149 |

(Continued)

FOREIGN PATENT DOCUMENTS

| KR | 1020080064476 | 7/2008 |
| KR | 1020120052554 | 5/2012 |
| KR | 1020130136342 | 12/2013 |

*Primary Examiner* — Viet Q Nguyen
(74) *Attorney, Agent, or Firm* — IP & T Group LLP

(57) ABSTRACT

A memory includes a first cell array including a plurality of first memory cells connected to a plurality of word lines, a bit line selection unit configured to select one or more bit lines among a plurality of bit lines based on repair information, a second cell array including a plurality of second memory cells connected to the plurality of word lines and the plurality of bit lines, wherein a group of the plurality of second memory cells connected to a corresponding word line stores the number of activations of the corresponding word line when the one or more connected bit lines are selected and an activation number update unit configured to update a value stored in the second memory cells, which are connected to the one or more selected bit lines and the activated word line among the plurality of word lines.

12 Claims, 9 Drawing Sheets

(56) References Cited

U.S. PATENT DOCUMENTS

| | | | |
|---|---|---|---|
| 2014/0355371 A1* | 12/2014 | Kim | G11C 11/406 365/230.03 |
| 2014/0359208 A1* | 12/2014 | Song | G11C 11/40615 711/106 |
| 2015/0089326 A1* | 3/2015 | Joo | G06F 11/1016 714/767 |
| 2015/0098288 A1* | 4/2015 | Bae | G11C 11/40618 365/222 |
| 2015/0179242 A1* | 6/2015 | Chi | G11C 11/406 365/222 |

* cited by examiner

MEMORY AND MEMORY SYSTEM INCLUDING THE SAME

CROSS-REFERENCE TO RELATED APPLICATIONS

The present application claims priority of Korean Patent Application Nos. 10-2012-0149944 and 10-2012-0149967, filed on Dec. 20, 2012, which are incorporated herein by reference in their entirety.

BACKGROUND

1. Field

Exemplary embodiments of the present invention relate to semiconductor design technology, and more particularly, to a memory core circuit, a memory, and a memory system including the same.

2. Description of the Related Art

As the degree of integration of a memory increases, a space between word lines included in the memory, such as DRAM is reduced. As the space between the word lines is reduced, a coupling effect between adjacent word lines increases.

Meanwhile, whenever data is inputted or outputted to or from a memory cell, a word line toggles between an activated state and a deactivated state. In this regard, as the coupling effect between adjacent word lines increases as described above, the data of a memory cell connected to a word line adjacent to a frequently activated word line may be degraded. Such a phenomenon is called word line disturbance or row hammer. Due to the word line disturbance, the data of a memory cell may be degraded within a retention time of the memory cell to be refreshed.

FIG. 1 is a diagram illustrating a part of a cell array included in DRAM for explaining the word line disturbance.

In FIG. 1, 'WLL' corresponds to a frequently activated word line (i.e., a word line having the large number of activations), and 'WLL−1' and 'WLL+1' correspond to adjacent word lines, which are disposed adjacent to the frequently activated WLL. Furthermore, 'CL' denotes a memory cell connected to the frequently activated word line WLL, 'CL−1' denotes a memory cell connected to the adjacent word line WLL−1, and 'CL+1' denotes a memory cell connected to the adjacent word line WLL+1. The memory cells CL, CL−1 and CL+1 include cell transistors TL, TL−1 and TL+1, respectively, and also include cell capacitors CAPL, CAPL−1 and CAPL+1, respectively.

When the word line WLL is activated or deactivated, the voltages of the word lines WLL−1 and 'WLL+1' are increased or decreased due to a coupling effect occurring among the word lines WLL and WLL−1 and among the word lines WLL and WLL+1. Accordingly, the amounts of charges charged in the cell capacitors CAPL−1 and CAPL+1 is affected, so that the data of the memory cells 'CL−1' and the 'CL+1' may be degraded.

Furthermore, as electromagnetic waves, which are generated while the word line toggles between the activated state and the deactivated state, introduce or discharge electrons into or from the cell capacitors of the memory cells connected to adjacent word lines, data are likely to be degraded.

To prevent degradation of data due to the word line disturbance, it may be necessary to provide a scheme for detecting the frequently activated word lines by counting the number of activations of respective word lines and a scheme for storing the count information. In the case where the scheme for detecting frequently activated word lines is introduced in a memory core circuit, a fail related to the count information may occur.

SUMMARY

Various embodiments of the present invention are directed to a memory core circuit, a memory, and a memory system, that may store counting information on the numbers of activations of the respective word lines in specific memory cells connected to the respective word lines, and that may repair a fail occurred in the specific memory cells when storing the numbers of activation of the respective word lines.

In an embodiment, a memory may include a first cell array including a plurality of first memory cells connected to a plurality of word lines, a bit line selection unit configured to select one or more bit lines among a plurality of bit lines based on repair information, a second cell array including a plurality of second memory cells connected to the plurality of word lines and the plurality of bit lines, wherein a group of the plurality of second memory cells connected to a corresponding word line stores the number of activations of the corresponding word line when the one or more connected bit lines are selected and an activation number update unit configured to update a value stored in the second memory cells, which are connected to the one or more selected bit lines and the activated word line among the plurality of word lines.

In an embodiment, a memory may include a first cell array including a plurality of first memory cells connected to a plurality of word lines, a bit line selection unit configured to select one or more bit lines among a plurality of bit lines in response to repair information, a second cell array including a plurality of second memory cells connected to the plurality of word lines and the plurality of bit lines, wherein a group of the plurality of second memory cells connected to a corresponding word line stores the number of activations of the corresponding word line when the one or more connected bit lines are selected, a transfer signal generating unit configured to activate a first transfer signal in response to an active command or a refresh command, and activate a second transfer signal after the first transfer signal is activated and a predetermined time lapses and a stored value updating unit configured to receive and increase a value outputted from the second memory cells connected to the one or more selected bit lines and the activated word line, in response to the first transfer signal, and to transfer the increased value to the second memory cells connected to the one or more selected bit lines and the activated word line, in response to the second transfer signal.

A stored value updating unit may receive and increase a value outputted from the second memory cells connected to the one or more selected bit lines and the activated word line, in response to the first transfer signal, and transfer the increased value to the second memory cells connected to the one or more selected bit lines and the activated word line, in response to the second transfer signal The bit line selection unit may transfer a value outputted from the one or more selected bit lines, which are selected in response to the repair information, to the stored value updating unit, and transfer a value outputted from the stored value updating unit to the one or more selected bit lines.

The stored value updating unit may transfer an initial value to the second memory cells, which are connected to the one or more selected bit lines and the activated word line, when the a normal refresh operation or a special refresh operation is performed.

The stored value updating unit may include an adding unit configured to increase a value inputted through an input terminal and output the increased value through an output terminal, a first transfer unit configured to transfer a value outputted from the bit line selection unit to the input terminal of the adding unit when the first transfer signal is activated, and a second transfer unit configured to transfer a value outputted through the output terminal of the adding unit to the bit line selection unit when the second transfer signal is activated The transfer signal generating unit may activate the first transfer signal after the active command or the refresh command is supplied and a first time lapses, and activate the second transfer signal when a second time lapses after the first transfer signal is activated and a second time lapses.

In an embodiment, a memory system may include a memory including a first cell array including a plurality of first memory cells connected to a plurality of word lines, and a second cell array including a plurality of second memory cells connected to the plurality of word lines and a plurality of bit lines, wherein a group of the plurality of second memory cells connected to a corresponding word line stores the number of activations of the corresponding word line when the one or more connected bit lines are selected, and wherein the memory is configured to generate an alert signal when the number of activations of the corresponding word line is equal to or greater than a reference number and a memory controller configured to apply an excessive address and at least one adjacent address having a value adjacent to the excessive address, to the memory in a special refresh mode, wherein the excessive address corresponds to a word line of which the number of activation is equal or greater than the reference number.

In an embodiment, a memory core circuit may include a first cell array including a plurality of first memory cells connected to a plurality of word lines, a bit line selection unit configured to select one or more bit lines among a plurality of bit lines in response to repair information and a second cell array including a plurality of second memory cells connected to the plurality of word lines and the plurality of bit lines, wherein a group of the plurality of second memory cells connected to a corresponding word line stores the number of activations of the corresponding word line when the one or more connected bit lines are selected.

When an active command is supplied, a value stored in the second memory cells connected to the one or more selected bit lines and a word line activated among the plurality of word lines, may be increased.

When a normal refresh operation or a special refresh operation is performed, a value stored in the second memory cells connected to the one or more selected bit lines and a word line activated among the plurality of word lines, may be initialized.

In the case where a special refresh operation is performed, the value stored in the second memory cells which are connected to the one or more selected bit lines, among the plurality of second memory cells which are connected to the word line activated among the first to Nth word lines, may be initialized In an embodiment, a memory may include a first cell array including a plurality of first memory cells connected to a plurality of word lines, a second cell array including a plurality of second memory cells connected to the plurality of word lines and one or more bit lines, wherein a group of the plurality of second memory cells connected to a corresponding word line stores the number of activations of the corresponding word line, a redundancy cell array including a plurality of redundancy memory cells connected to the plurality of word lines and one or more redundancy bit lines for replacing the one or more bit lines, wherein a group of the plurality of redundancy memory cells connected to a corresponding word line stores the number of activations of the corresponding word line when the one or more bit lines are replaced and an activation number update unit configured to update a value stored in the second memory cells connected to the activated word line, and update a value stored in the redundancy memory cells connected to the activated word line when the one or more bit lines are replaced.

In an embodiment, a memory may include a first cell array including a plurality of first memory cells connected to a plurality of word lines, a second cell array including a plurality of second memory cells connected to the plurality of word lines and one or more bit lines, wherein a group of the plurality of second memory cells connected to a corresponding word line stores the number of activations of the corresponding word line, a redundancy cell array including a plurality of redundancy memory cells are connected to the plurality of word lines and one or more redundancy bit lines for replacing the one or more bit lines, wherein a group of the plurality of redundancy memory cells connected to a corresponding word line stores the number of activations of the corresponding word lines when the one or more bit lines are replaced, a transfer signal generating unit configured to activate a first transfer signal in response to an active command or a refresh command, and activate a second transfer signal after the first transfer signal is activated and a predetermined time lapses and a stored value updating unit configured to receive and increase a value outputted from the second memory cells or the redundancy memory cells, which are connected to the activated word line, in response to the first transfer signal and a redundancy signal, and transfer the increased value to the second memory cells or the redundancy memory cells, which are connected to the activated word line, in response to the second transfer signal and the redundancy signal.

The stored value updating unit may receive and increase the value outputted from the second memory cells connected to the activated word line, in response to the first transfer signal and the redundancy signal, and transfer the increased value to the second memory cells connected to the activated word line, in response to the second transfer signal and the redundancy signal, and when the one or more bit lines are replaced, the stored value updating unit may receive and increase the value outputted from the redundancy memory cells connected to the activated word line, in response to the first transfer signal and the redundancy signal, and transfer the increased value to the redundancy memory cells connected to the activated word line, in response to the second transfer signal and the redundancy signal.

When a normal refresh operation or a special refresh operation is performed, the stored value updating unit may transfer an initial value to the second memory cells, which are connected to a activated word line, and transfer an initial value to the redundancy memory cells connected to the activated word line when the one or more bit lines are replaced.

The transfer signal generating unit may activate the first transfer signal in response to a refresh command and activate the second transfer signal after the first transfer signal is activated and the predetermined time lapses The stored value updating unit may activate one column signal of a normal column signal and a redundancy column signal in response to a column signal, which is activated when the first transfer signal or the second transfer signal is activated, the redundancy column signal representing whether the one or more bit lines are replaced or not, and the value stored in the second memory cells connected to the activated word line may be updated when the normal column signal is activated, and the value stored in the redundancy memory cells connected to the activated word line may be updated when the redundancy column signal is activated.

The stored value updating unit may include, an adding unit configured to increase a value inputted through an input terminal thereof and output the increased value through an output terminal thereof, a first transfer unit configured to transfer a value outputted from the second memory cells or the redundancy memory cells, which are connected to the activated word line, to the input terminal of the adding unit when the first transfer signal is activated, and a second transfer unit configured to transfer a value outputted from the output terminal of the adding unit to the second memory cells or the redundancy memory cells, which are connected to the activated word line when the second transfer signal is activated, and to transfer an initial value to the second memory cells or the redundancy memory cells, which are connected to the activated word line, when a normal refresh operation or a special refresh operation is performed.

The memory may further include an alert signal generation unit configured to activate an alert signal when the number of activations of the activated word line, which is stored in the second memory cells or the redundancy memory cells connected to the activated word line, is equal to or greater than a reference number. The memory may further include an address storage unit configured to store an address corresponding to the activated word line when the alert signal is activated.

In an embodiment, a memory system may include a memory including a first cell array including a plurality of first memory cells connected to a plurality of word lines, a second cell array including a plurality of second memory cells connected to the plurality of word lines and one or more bit lines, wherein a group of the plurality of second memory cells connected to a corresponding word line stores the number of activations of the corresponding word line, and a redundancy cell array including a plurality of redundancy memory cells connected to the plurality of word lines and one or more redundancy bit lines for replacing the one or more bit lines, wherein a group of the plurality of redundancy memory cells connected to a corresponding word line stores the number of activation of the corresponding word line when the one or more bit lines are replaced, and wherein the memory generating an alert signal when the number of activations of the corresponding word line is equal to or greater than a reference number and a memory controller an excessive address and at least one adjacent address having a value adjacent to the excessive address, to the memory in a special refresh mode, wherein the excessive address corresponds to a word line of which the number of activations is equal or greater than the reference number.

The memory controller may control the memory to enter the special refresh mode when the alert signal is activated.

When the memory operates in the special refresh mode, the memory may activate at least one adjacent word line, which is adjacent to a word line of which the number of activations is equal to or greater than the reference number, in response to an active command, the excessive address and the adjacent address.

In an embodiment, a memory core circuit may include a first cell array including a plurality of first memory cells connected to a plurality of word lines, a second cell array including a plurality of second memory cells connected to the plurality of word lines and one or more bit lines, wherein a group of the plurality of second memory cells connected to a corresponding word line stores the number of activations of the corresponding word line and a redundancy cell array including a plurality of redundancy memory cells connected to the plurality of word lines and one or more redundancy bit lines for replacing the one or more bit lines, wherein a group of the plurality of redundancy memory cells connected to a corresponding word line stores the number of activations of the corresponding word line when the one or more bit lines are replaced.

When an active command is supplied, a value stored in the second memory cells connected to the activated word line may be increased, and a value stored in the redundancy memory cells connected to the activated word line may be increased when the one or more bit lines are replaced.

When a normal refresh operation or a special refresh operation is performed, a value stored in the second memory cells connected to the activated word line may be initialized, and a value stored in the redundancy memory cells connected to the activated word line may be initialized when the one or more bit lines are replaced.

According to the embodiments of the present invention, the numbers of activations of respective word lines are counted and stored in specific memory cells connected to the respective word lines, and a fail occurred in the specific memory cells when storing the numbers of activations of the respective word lines may be repaired, whereby it may be possible to prevent the occurrence of a concern present in counting the numbers of activations of word lines.

DETAILED DESCRIPTION

Figure 1:
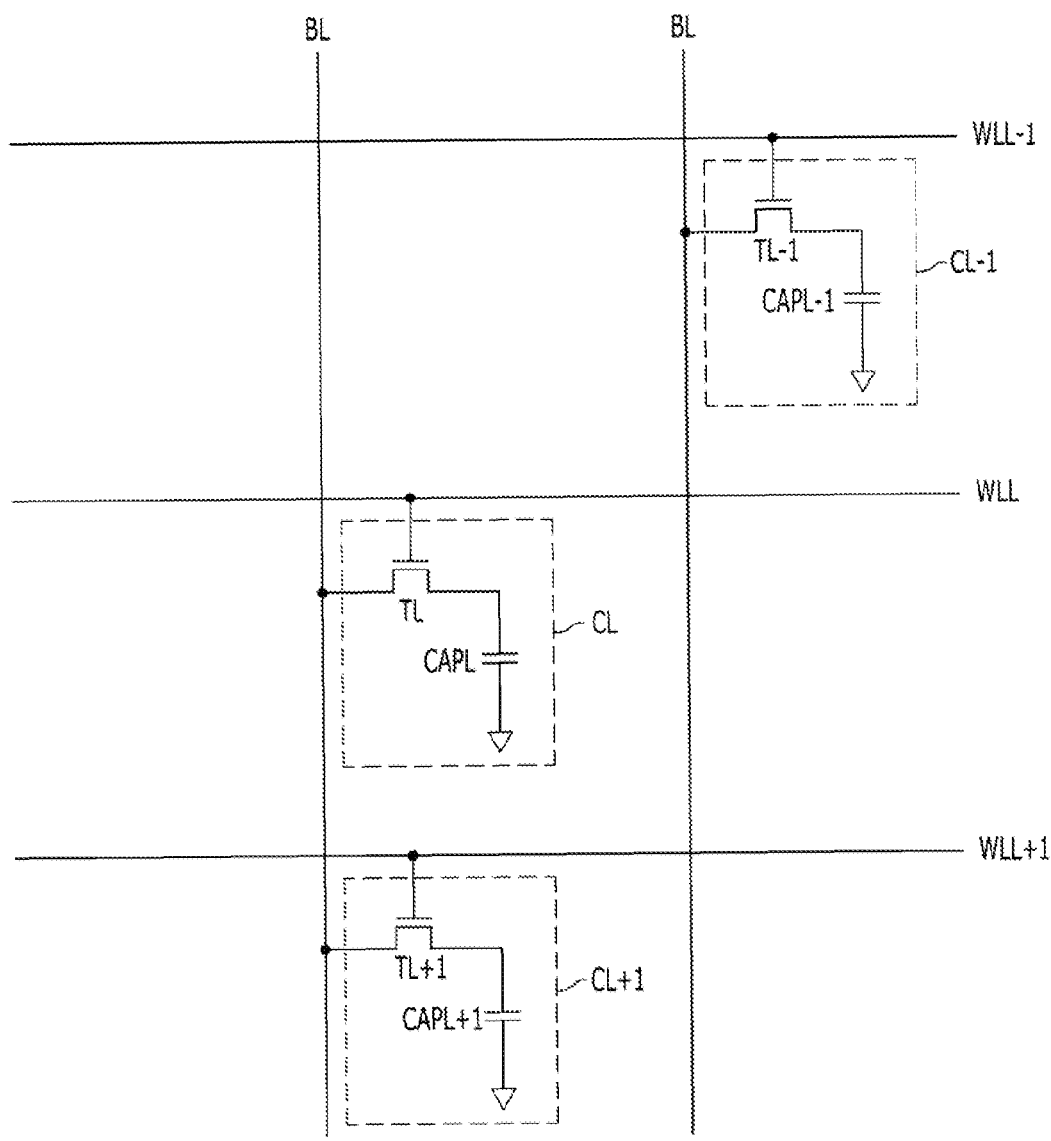
FIG. 1 is a diagram illustrating a part of a cell array included in DRAM for explaining word line disturbance.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Hereinafter, a word line adjacent to a specific word line may mean a word line, which is disposed closer to the specific word line than a predetermined distance. At this time, the number of word lines disposed between the specific word line and the adjacent word line may be equal to or less than a predetermined number. The range of a word line or word lines adjacent to the specific word line may be changed according to a design. Hereinbelow, descriptions will be made for the case in which an adjacent word line is a word line, which is disposed directly next to a specific word line (that is, the number of word lines disposed between the specific word line and the adjacent word line is 0).

Figure 2:
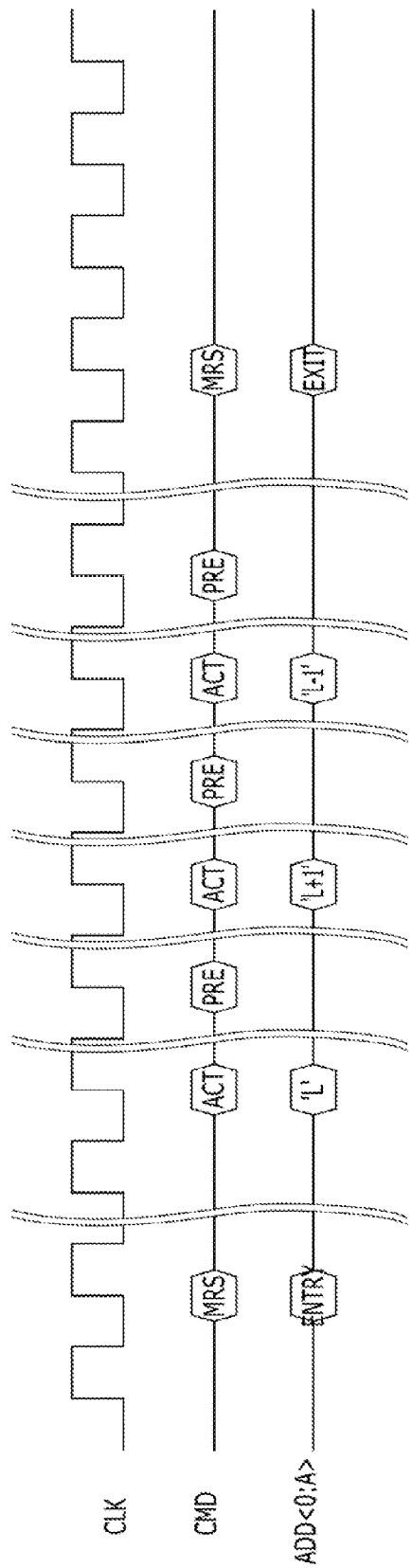
FIG. 2 is a timing diagram for explaining a special refresh operation in a memory system.

FIG. 2 is a timing diagram explaining a special refresh operation in a memory system.

A memory (not shown in FIG. 2) includes first to $N^{th}$ word lines (N is a natural number), and a memory controller (not shown in FIG. 2) may supply various signals, such as a clock signal CLK, command signals CMDs, addresses ADD<0:A>, and data (not shown in FIG. 2) to the memory to controls the memory. Hereinafter, the value of an address corresponding to an $L^{th}$ word line (L is a natural number satisfying $1 \leq L \leq N$) among the first to $N^{th}$ word lines will be denoted by 'L'.

The number of activations of a word line is equal to the number of address inputs corresponding to the word lines, which are inputted together with an active command from the memory controller to the memory. For example, when the memory controller inputs an address '15' for ten times together with the active command, it represents that a $15^{th}$ word line has been activated ten times. Thus, the memory or the memory controller determines whether a frequently activated word line is detected by counting the numbers of applications of the address corresponding to the word line, where the frequently activated word line denotes a specific word line activated more times than the reference number. The reference number may be a value that is determined internally of a memory system or a value that is inputted from an external source other than the memory system.

When a first specific address combination is inputted from the memory controller together with a mode resistor set (MRS) command MRS, the memory enters a special refresh mode by MRS setting ('entry' setting). Furthermore, when a second specific address combination is inputted together with the MRS command MRS, the memory exits the special refresh mode ('exit' setting). Compensating for data degradation by entering the special refresh mode through the MRS command MRS and the specific address combination is for an illustrative purpose only. For example, it may be possible to control the memory to perform the compensating operation using a newly defined signal or a combination of existing signals according to a design.

In the special refresh mode, the memory controller operates the memory by the unit of a 'compensation cycle' including an operation of inputting an address (hereinafter, referred to as an excessive address) of which the number of input times together with the active command is equal to or greater than the reference number and an operation of activating word lines, which are adjacent to a word line corresponding to the excessive address. Hereinafter, descriptions will be made for the case in which the address 'L' corresponding to the $L^{th}$ word line is the excessive address.

In each compensation cycle, a first active command ACT and the excessive address L are inputted to the memory. After a predetermined time lapses, a precharge command PRE is inputted to the memory. The memory activates the $L^{th}$ word line in response to the active command ACT and the address L, and deactivates the activated $L^{th}$ word line in response to the precharge command PRE.

Then, addresses L+1 and L−1 corresponding to word lines adjacent to the $L^{th}$ word line are sequentially inputted together with the active command ACT. In FIG. 2, a second active command ACT and the address L+1 are inputted, and a third active command ACT and the address L−1 are inputted. Accordingly, an $L+1^{th}$ word line and an $L-1^{th}$ word line of the memory are sequentially activated. For reference, the input order of the address L+1 and the address L−1 may be changed.

When the operation of activating the word lines adjacent to the $L^{th}$ word line is completed, the memory exits the special refresh mode by the combination of the MRS command and an address inputted from the memory controller.

When a certain word line is activated, the data of the memory cells connected to the word line are refreshed. Therefore, in the special refresh mode, by activating the word lines adjacent to the word line corresponding to the excessive address, it may be possible to substantially prevent data degradation from occurring due to word line disturbance.

To perform the above-described special refresh operation, it may be necessary to detect an excessive address. Hereafter, descriptions will be made for a memory core circuit, which stores the numbers of activation of respective word lines in memory cells to detect an excessive address and may repair a fail occurred in the memory cells storing the numbers of activations of the respective word lines, a memory, and a memory system.

Figure 3:
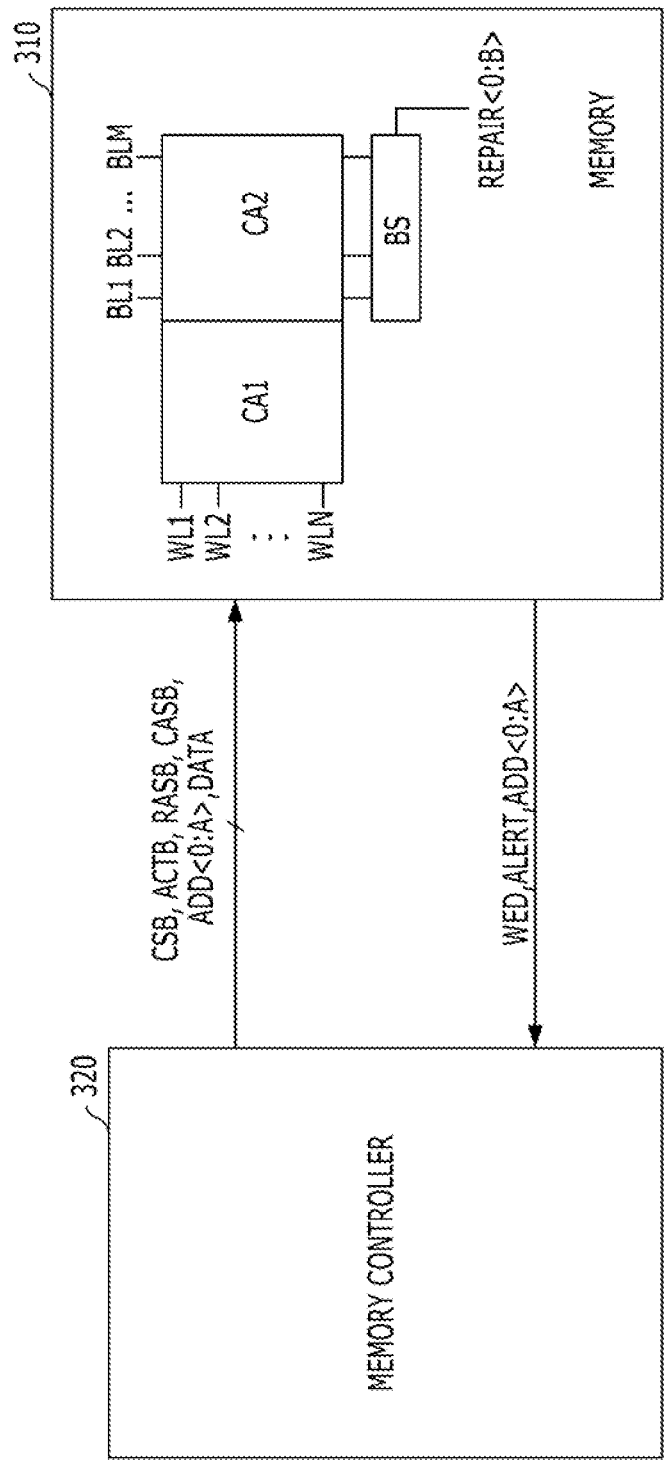
FIG. 3 is a configuration diagram illustrating a memory system in accordance with an embodiment of the present invention.

FIG. 3 is a configuration diagram illustrating a memory system in accordance with an embodiment of the present invention.

Referring to FIG. 3, a memory system includes a memory 310 and a memory controller 320. The memory 310 includes a first cell array CA1 including a plurality of first memory cells (shown in FIG. 4), which are connected to first to $N^{th}$ word lines WL1 to WLN, and a second cell array CA2 including a plurality of second memory cells (shown in FIG. 4), which are connected to the first to $N^{th}$ word lines WL1 to WLN, are connected to first to $M^{th}$ bit lines BL1 to BLM. A group of the plurality of the plurality of second memory cells connected to a corresponding word line among the first to $N^{th}$ word lines WL1 to WLN stores the numbers of activations of the corresponding word line connected when the bit lines BL1 to BLM are selected. The memory 310 may generate an alert signal ALERT when any of the numbers of activation of the first to $N^{th}$ word lines WL1 to WLN is equal to or greater than a reference number. The memory 310 further includes a bit line selection unit BS, which selects at least one bit line among the first to $M^{th}$ bit lines BL1 to BLM in response to repair information REPAIR<0:B>. The memory controller 320 may supply an excessive address corresponding to a word line (i.e., the frequently activated word line) of which the number of activation is equal to or greater than the reference number, among the first to $N^{th}$ word lines WL1 to WLN, and at least one adjacent address with a value adjacent to the excessive address to the memory 310. For example, in the case where an excessive address corresponding to a word line of which the number of activation is equal to or greater than the reference number is '5', adjacent addresses may have a value of '4' or '6'.

For reference, the memory controller 320 inputs command signals including a chip select signal CSB, an active signal ACTB, a row address strobe signal RASB, a column address strobe signal CASB and a write enable signal WEB to the memory 310. Supplying of a specific command from the memory controller 320 to the memory 310 suggests that a combination of the command signals CSB, ACTB, RASB, CASB and WEB corresponds to the specific command. For example, the fact that the memory controller 320 supplies an active command to the memory 310 means that a combination of the command signals CSB, ACTB, RASB, CASB and WEB supplied by the memory controller 320 to the memory 310 corresponds to the active command. A command decoder (not shown in FIG. 3) included in the memory 310 decodes the command signals CSB, ACTB, RASB, CASB and WEB and generates a command internally of the memory 310. Also, the memory controller 320 supplies an address ADD<0:A>, data DATA, and so forth to the memory 310 in addition to the plurality of command signals CSB, ACTB, RASB, CASB and WEB, for operations of the memory 310.

Hereafter, the special refresh mode represents an operation mode in which a word line adjacent to a word line with the number of activations equal to or greater than the reference number is activated, and the data of a plurality of memory cells connected to the word line adjacent to the word line with the number of activations equal to or greater than the reference number are refreshed.

The memory system will be described below in detail with reference to FIG. 3.

The first cell array CA1 includes the plurality of first memory cells, which are connected to the first to $N^{th}$ word lines WL1 to WLN. The first memory cells are memory cells suitable for storing general data, which are inputted to and outputted from the memory 310. The second cell array CA2 includes the plurality of second memory cells, which are connected to the first to $N^{th}$ word lines WL1 to WLN in a row direction and are connected to the first to $M^{th}$ bit lines BL1 to BLM in a column direction. In memory cells among the plurality of second memory cells, which are connected to selected bit lines, there are stored the number of activations of a word line among the first to $N^{th}$ word lines WL1 to WLN, which is connected to the memory cells. For example, when first to $L^{th}$ (1≤L≤M) bit lines BL1 to BLL are selected among the first to $M^{th}$ bit lines BL1 to BLM, the number of activations of a $K^{th}$ word line WLK is stored in second memory cells, which are connected to the first to $L^{th}$ bit lines BL1 to BLL, among a plurality of second memory cells, which are connected to the $K^{th}$ word line WLK.

Bit lines may be selected by the repair information REPAIR<0:B>, which is stored in the memory 310. The repair information REPAIR<0:B> may provide information indicating in which bit line among the first to $M^{th}$ bit lines BL1 to BLM a fail has occurred, and may provide information for selecting bit lines in which no fail has occurred among the first to $M^{th}$ bit lines BL1 to BLM. To generate the repair information REPAIR<0:B>, the memory 310 may detect a bit line among the first to $M^{th}$ bit lines BL1 to BLM in which a fail has occurred through a test operation. The bit line selection unit BS included in the memory 310 stores information designating a bit line for which it is determined through a test that a fail has occurred as the repair information REPAIR<0:B>, selects at least one bit line among the first to $M^{th}$ bit lines BL1 to BLM in which a fail has not occurred by using such repair information REPAIR<0:B>, and stores the number of activations of a word line in second memory cells, which are connected to the selected bit line.

An occurrence of fail in a bit line suggests that a fail has occurred in a second memory cell connected to the bit line or a fail has occurred in the bit line itself or a peripheral circuit of the bit line so that an operation for writing data in the second memory cell connected to the corresponding bit line or reading data from the second memory cell may not be normally performed.

Hereinbelow, a method for the memory 310 to store the numbers of activations of the first to $N^{th}$ word lines WL1 to WLN in the second cell array CA2 and update values stored in the second cell array CA2 will be described.

The memory 310 decodes the plurality of command signals CSB, ACTB, RASB, CASB and WEB, which are supplied from the memory controller 320, and generates an active command for activating a word line, a precharge command for precharging a word line, a refresh command for performing a refresh operation for a memory cell, a read command for reading data of a memory cell, a write command for writing data in a memory cell, and an MRS (mode register set) command for setting a mode register set.

The memory 310 updates a value stored in a second memory cell, which is connected to at least one selected bit line, among a plurality of second memory cells connected to an activated word line. In detail, the memory 310 (1) increases a value stored in a second memory cell, which is connected to at least one selected bit line, among a plurality of second memory cells connected to an activated word line, in the case of activating a word line corresponding to an address ADD<0:A> based on an active command, and (2) initializes a value stored in a second memory cell, which is connected to at least one selected bit line, among a plurality of second memory cells connected to an activated word line, in the case of performing a normal refresh operation or a special refresh operation. Initialization means that a value stored in a second memory cell, which is connected to at least one selected bit line (that is, the stored number of activations of a word line) is controlled to have a value corresponding to when the number of activations is 0.

(1) Case of Increasing a Value Stored in a Second Memory Cell, which is Connected to at Least One Selected Bit Line To perform the special refresh operation described above with reference to FIG. 2, it may be necessary to detect an excessive address. Therefore, the numbers of activations of respective word lines should be counted in response to the active command. Accordingly, when a word line corresponding to an address ADD<0:A> is activated in response to the active command, the memory 310 increases a value stored in a second memory cell, which is connected to at least one bit line, among a plurality of second memory cells connected to the word line.

In detail, since a plurality of first memory cells and a plurality of second memory cells, which are connected to the activated word line are connected to bit lines corresponding to them, data are transferred between memory cells connected to the activated word line and the bit lines. A value stored in second memory cells connected to one or more selected bit lines among the plurality of second memory cells corresponds to a value acquired by converting the number of activations of the word line to which the second memory cells are connected into a binary number. Thus, the memory 310 increases the binary value outputted from the second memory cells connected to the one or more selected bit lines among the plurality of second memory cells, which are connected to the activated word line, by '1' in response to the active command, and stores the increased value in the corresponding second memory cells. As a consequence, each time a word line is activated in response to the active command, the binary value stored in the second memory cells connected to the one or more selected bit lines among the plurality of second memory cells, which are connected to the activated word line, is increased by '1'.

Furthermore, in the case where the value stored in the plurality of second memory cells connected to the activated word line is equal to or greater than the reference number, the memory 310 activates the alert signal ALERT, which notifies that it may be necessary to perform the special refresh operation. The memory 310 may store the address ADD<0:A>, which is supplied to the memory 310 when the alert signal ALERT is activated.

When the alert signal ALERT is activated, the memory controller 320 may control the memory 310 to perform the special refresh operation described above in detail with reference to FIG. 2. The memory controller 320 may control the memory 310 to enter the special refresh mode immediately when the alert signal ALERT is activated, or may control the memory 310 to enter the special refresh mode when a preset time lapses after the alert signal ALERT is activated. The memory 310 operates in the special refresh mode from a time when it enters the special refresh mode to a time when it exits the special refresh mode.

(2) Case of Initializing a Value Stored in a Second Memory Cell, which is Connected to at Least One Selected Bit Line When the memory 310 refreshes the data of a plurality of first memory cells that are connected to a word line activated among the first to $N^{th}$ word lines WL1 to WLN included in the memory 310 in the normal refresh operation, the numbers of activations of respective word lines should be re-counted from initial states, and a word line of which the number of activations is equal to or greater than the reference number should be detected. Also, when a specific word line is activated over the reference number, and thus, the special refresh operation is performed for a word line adjacent to the specific word line, the number of activations of the specific word line should be re-counted from an initial state, and a word line of which the number of activations is equal to or greater than the reference number should be detected.

Therefore, when the data of a plurality of first memory cells connected to an activated word line are refreshed in the normal refresh operation or the special refresh operation, the memory 310 initializes a value stored in second memory cells, which are connected to one or more selected bit lines, among the plurality of second memory cells, which are connected to the activated word line.

For reference, the reason to initialize a value stored in second memory cells, which are connected to one or more selected bit lines, among the plurality of second memory cells, which are connected to the activated word line, in the normal refresh operation, resides in that, since a plurality of word lines are sequentially activated in the normal refresh operation, a word line adjacent to an activated word line is immediately activated and the data of a plurality of first memory cells, which are connected to the adjacent word line are refreshed, and, therefore, because word line disturbance does not occur, it may not be necessary to immediately perform the special refresh operation.

In detail, in the normal refresh operation, the memory 310 initializes a value outputted from second memory cells, which are connected to one or more selected bit lines, among the plurality of second memory cells, which are connected to the activated word line, to '0', and stores the initialized value in the corresponding second memory cells. Also, in the special refresh operation, the memory 310 initializes a value outputted from second memory cells, which are connected to one or more selected bit lines, among the plurality of second memory cells, which are connected to a first activated word line (a word line corresponding to an excessive word line) in the compensation cycle, to '0', and stores the initialized value in the corresponding second memory cells.

Operations of the memory system in the special refresh operation will be described below with reference to FIG. 3.

When the alert signal ALERT is activated, the memory controller 320 controls the memory 310 to enter the special refresh mode by a combination of the plurality of command signals CSB, ACTB, RASB, CASB and WEB and the address ADD<0:A>. If the memory 310 enters the special refresh mode, the memory controller 320 sequentially supplies an excessive address L and addresses L+1 and L−1 corresponding to word lines adjacent to a word line corresponding to the excessive address L, along with the active command ACT. The memory 310 activates the $L^{th}$ word line WLL, the $L+1^{th}$ word line WLL+1 and the $L-1^{th}$ word line WLL−1, which respectively correspond to the addresses L, L+1 and L−1, in response to the active command ACT. When the special refresh operation is completed, the memory controller 320 controls the memory 310 to exit the special refresh mode by a combination of the plurality of command signals CSB, ACTB, RASB, CASB and WEB and the address ADD<0:A>. The memory 310 may also automatically exit the special refresh mode when the three active operations are completed.

In the memory system in accordance with the embodiment of the present invention, the numbers of activation of respective word lines are stored using memory cells, which are connected to the corresponding word lines. At this time, in the case where a fail occurs in a memory cell, which stores the number of activation of a word line or a bit line to which such a memory cell is connected, the special refresh operation may not be properly performed. Therefore, in the memory system in accordance with the embodiment of the present invention, redundancies are provided in memory cells for storing the numbers of activations of word lines and bit lines to which the memory cells are connected, a bit line (or a memory cell) in which a fail has occurred is detected through a test, and the numbers of activations of the word lines are stored in memory cells, which are connected to bit lines excluding the detected bit line, whereby the special refresh operation may be normally performed.

Figure 4:
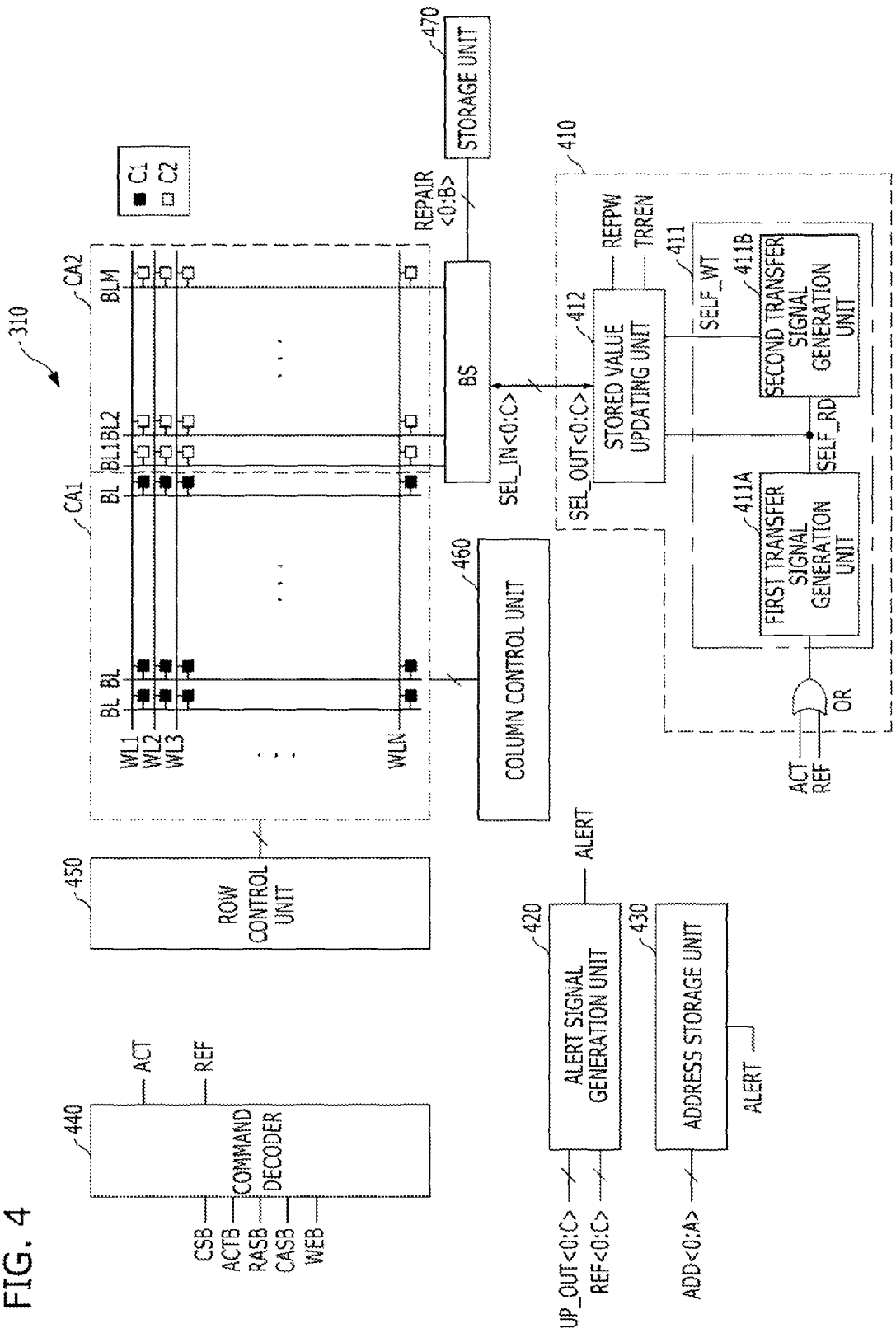
FIG. 4 is a configuration diagram illustrating a memory in accordance with another embodiment of the present invention.

FIG. 4 is a configuration diagram illustrating the memory 310 in accordance with another embodiment of the present invention.

Referring to FIG. 4, the memory 310 includes a first cell array CA1 including a plurality of first memory cells C1, which are connected to first to $N^{th}$ word lines WL1 to WLN, a bit line selection unit BS that may select at least one bit line among first to $M^{th}$ bit lines BL1 to BLM in response to repair information REPAIR<0:B>, a second cell array CA2 including a plurality of second memory cells C2, which are connected to first to $N^{th}$ word lines WL1 to WLN, are connected to the first to $M^{th}$ bit lines BL1 to BLM and store the numbers of activation of word lines connected to them among the first to $N^{th}$ word lines WL1 to WLN when bit lines connected to them are selected, an activation number update unit 410 that may update a value stored in the second memory cell C2, which is connected to the at least one selected bit line, among a plurality of second memory cells C2 connected to a word line activated among the first to $N^{th}$ word lines WL1 to WLN, an alert signal generation unit 420 that may activate an alert signal ALERT when the number of activation of a word line corresponding to an address ADD<0:A> stored in a second memory cell C2, which is connected to the at least one bit line, among the plurality of second memory cells C2 connected to a word line corresponding to the address ADD<0:A>, is equal to or greater than a reference number, and an address storage unit 430 that may store the address ADD<0:A> when the alert signal ALERT is activated.

The memory 310 may further include a storage unit 470 configured to store the repair information REPAIR<0:B>. The storage unit 470 configured to store the repair information REPAIR<0:B> may include a plurality of fuses.

Further, the memory 310 includes a command decoder 440 that may decode the command signals CSB, ACTB, RASB, CASB and WEB inputted from the memory controller 320 and may generate an active command ACT, a precharge command (not shown in FIG. 4), a refresh command REF, a read command (not shown in FIG. 4), a write command (not shown in FIG. 4), an MRS command (not shown in FIG. 4), and so forth. The memory 310 also includes the first to $M^{th}$ bit lines BL1 to BLM connected to respective memory cells, a row control unit 450 that may control row operations of the cell arrays CA1 and CA2, and a column control unit 460 that may control column operations of the first cell array CA1.

The memory 310 will be described below in detail with reference to FIG. 4.

Data to be inputted to and outputted from the memory 310 are stored in the first cell array CA1, and the numbers of activations of the first to $N^{th}$ word lines WL1 to WLN are stored in the second cell array CA2. The row control unit 450 performs an operation of activating at least one word line among the first to $N^{th}$ word lines WL1 to WLN when the active command ACT, the refresh command REF, and so forth are supplied thereto, and the column control unit 460 performs an operation necessary to read data from a plurality of first memory cells, which are connected to an activated word line or write data in a plurality of first memory cells, which are connected to an activated word line. Since operations of reading and writing data from and to the first cell array CA1 are generally known in the art and are not directly associated with the embodiment of the present invention, detailed descriptions thereof will be omitted herein.

The bit line selection unit BS transfers a value SEL_OUT<0:C> (1≤C≤M) outputted from one or more bit lines selected among the first to $M^{th}$ bit lines BL1 to BLM to the activation number update unit 410 in response to the repair information REPAIR<0:B>, and transfers a value SEL_IN<0:C> outputted from the activation time number update unit 410 to the one or more selected bit lines.

The activation time number update unit 410 updates a value stored in second memory cells which are connected to the one or more selected bit lines, among a plurality of second memory cells which are connected to the activated word line. (1) In the case where a word line corresponding to an address ADD<0:A> is activated in response to the active command ACT, the activation number update unit 410 increases a value stored in second memory cells, which are connected to one or more selected bit lines, among a plurality of second memory cells, which are connected to the activated word line. (2) In the case where a word line is activated by performing the normal refresh operation or the special refresh operation, the activation number update unit 410 initializes a value stored in second memory cells, which are connected to one or more selected bit lines, among a plurality of second memory cells, which are connected to the activated word line. Initialization means that the number of activations stored in the second memory cells, which are connected to the one or more selected bit lines is set to '0'.

(1) Case of Increasing a Value Stored in Second Memory Cells C2, which are Connected to One or More Selected Bit Lines The activation number update unit 410 reads a value stored in a plurality of second memory cells C2, which are connected to an activated word line, when a predetermined time (a first time) has lapsed after the active command ACT is supplied. The bit line selection unit BS transfers a value stored in second memory cells C2, which are connected to one or more selected bit lines, in the read value, to the activation number update unit 410. The activation number update unit 410 increases a transferred value SEL_OUT<0:C> by '1' and transfers an increased value SEL_IN<0:C> to the bit line selection unit BS. The increased value SEL_IN<0:C> transferred to the bit line selection unit BS is written in the second memory cells C2, which are connected to the one or more selected bit lines, among the second memory cells C2, which are connected to the activated word line.

(2) Case of Initializing a Value Stored in Second Memory Cells C2, which are Connected to One or More Selected Bit Lines In the case where the memory 310 performs the normal refresh operation, the activation number update unit 410 reads a value stored in a plurality of second memory cells C2, which are connected to an activated word line, in response to the refresh command REF. The bit line selection unit BS transfers a value stored in second memory cells C2, which are connected to one or more selected bit lines, in the read value, to the activation number update unit 410. The activation number update unit 410 initializes a transferred value SEL_OUT<0:C> to an initial value (for example, '0') and transfers an initialized value SEL_IN<0:C> to the bit line selection unit BS. The initialized value SEL_IN<0:C> transferred to the bit line selection unit BS is written in the second memory cells C2, which are connected to the one or more selected bit lines, among the second memory cells C2, which are connected to the activated word line.

Moreover, in the case where the memory 310 performs the special refresh operation, the activation number update unit 410 reads a value stored in a plurality of second memory cells C2 which are connected to an activated word line, in response to the active command ACT. The bit line selection unit BS transfers a value stored in second memory cells C2, which are connected to one or more selected bit lines, in the read value, to the activation number update unit 410. The activation number update unit 410 initializes a transferred value SEL_OUT<0:C> to an initial value (for example, '0') and transfers an initialized value SEL_IN<0:C> to the bit line selection unit BS. The initialized value SEL_IN<0:C> transferred to the bit line selection unit BS is written in the second memory cells C2, which are connected to the one or more selected bit lines, among the second memory cells C2, which are connected to the activated word line.

For the above-described operations, the activation number update unit 410 includes a transfer signal generating unit 411 and a stored value updating unit 412.

The transfer signal generating unit 411 may activate a first transfer signal SELF_RD in response to the active command ACT or the refresh command REF, and may activate a second transfer signal SELF_WT when a predetermined time lapses after the first transfer signal SELF_RD is activated.

In detail, the transfer signal generating unit 411 activates the first transfer signal SELF_RD after a first time lapses from a time when the active command ACT or the refresh command REF is supplied from the command decoder 440. The first time may be tRCD (RAS to CAS delay: a time during which charges of a bit line BL are sufficiently distributed after a RAS signal is activated and a bit line sense amplifier amplifies the data of the bit line BL). Next, the transfer signal generating unit 411 activates the second transfer signal SELF_WT after a second time lapses from a time when the first transfer signal SELF_RD is activated. The second time may be a time, which is required until a value outputted from second memory cells C2 connected to one or more selected bit lines among a plurality of second memory cells C2 connected to an activated word line is completely updated by the stored value updating unit 412.

For these operations, the transfer signal generating unit 411 includes a first transfer signal generation unit 411A that may delay the active command ACT or the refresh command REF by the first time and generate the first transfer signal SELF_RD, and a second transfer signal generation unit 411B that may delay the first transfer signal SELF_RD by the second time and generate the second transfer signal SELF_WT. The first transfer signal generation unit 411A and the second transfer signal generation unit 411B may delay their inputs in synchronization with a clock signal or may delay their inputs in desynchronization with a clock signal.

The bit line selection unit BS selects one or more bit lines among the first to $M^{th}$ bit lines BL1 to BLM in response to the repair information REPAIR<0:B>, and transfers the value SEL_OUT<0:C> outputted from the second memory cells C2 which are connected to the one or more selected bit lines, among the plurality of second memory cells C2 which are connected to the activated word line, to the stored value updating unit 412. The stored value updating unit 412 receives and updates the value SEL_OUT<0:C> transferred from the bit line selection unit BS, in response to the first transfer signal SELF_RD, and transfers the updated value SEL_IN<0:C> to the bit line selection unit BS in response to the second transfer signal SELF_WT. The bit line selection unit BS transfers the updated value SEL_IN<0:C> to the one or more bit lines selected among the first to $M^{th}$ bit lines BL1 to BLM in response to the repair information REPAIR<0:B>. Accordingly, the updated value SEL_IN<0:C> is written in the second memory cells C2 which are connected to the one or more selected bit lines, among the plurality of second memory cells C2 which are connected to the activated word line.

For reference, the value SEL_OUT<0:C> represents a value which is outputted from one or more bit lines selected among the first to $M^{th}$ bit lines BL1 to BLM and is transferred from the bit line selection unit BS to the stored value updating unit 412. The value SEL_IN<0:C> represents a value which is inputted to one or more bit lines selected among the first to $M^{th}$ bit lines BL1 to BLM and is transferred from the stored value updating unit 412 to the bit line selection unit BS.

In detail, (1) when a word line corresponding to an address ADD<0:A> is activated in response to the active command ACT, a value outputted from a plurality of second memory cells C2 which are connected to the activated word line is transferred to the bit line selection unit BS. The bit line selection unit BS transfers a value transferred through one or more bit lines selected among the first to $M^{th}$ bit lines BL1 to BLM, to the stored value updating unit 412. The stored value updating unit 412 receives the value transferred from the bit line selection unit BS when the first transfer signal SELF_RD is activated, and internally increases the value by '1'. The stored value updating unit 412 transfers the increased value to the bit line selection unit BS when the second transfer signal SELF_WT is activated. The bit line selection unit BS transfers the value transferred from the stored value updating unit 412 to the one or more bit lines selected among the first to $M^{th}$ bit lines BL1 to BLM. The transferred value is written in second memory cells C2, which are connected to the one or more selected bit lines, among the plurality of second memory cells C2, which are connected to the activated word line.

Also, (2) in the normal refresh operation or the special refresh operation, the stored value updating unit 412 initializes a value transferred from the bit line selection unit BS and transfers the initialized value to the bit line selection unit BS. A way for the bit line selection unit BS to transfer a signal is the same as described above.

In the normal refresh operation, if the first transfer signal SELF_RD is activated when the first time lapses after the refresh command REF is activated, the stored value updating unit 412 receives a value transferred from the bit line selection unit BS. The stored value updating unit 412 initializes the transferred value to an initial value in response to a refresh signal REFPW, which is activated for tRFC as a refresh time during one cycle. The stored value updating unit 412 transfers the initial value to the bit line selection unit BS when the second transfer signal SELF_WT is activated.

In the special refresh operation, when a word line corresponding to an address ADD<0:A> is activated in response to the active command ACT, if the first transfer signal SELF_RD is activated when the first time lapses after the active command REF is activated, the stored value updating unit 412 receives a value transferred from the bit line selection unit BS. The stored value updating unit 412 initializes the transferred value to an initial value in response to a special refresh signal TRREN, which is activated in the special refresh operation. The stored value updating unit 412 transfers the initial value to the bit line selection unit BS when the second transfer signal SELF_WT is activated.

When the value increased or updated by the stored value updating unit 412 is stored in the second memory cells C2, which are connected to the one or more selected bit lines, among the plurality of second memory cells C2, which are connected to the activated word line, the operation of counting the numbers of activations of the word lines is completed.

The alert signal generation unit 420 compares a value UP_OUT<0:C> updated by the stored value updating unit 412 with information REF<0:C> on the reference number, and generates the alert signal ALERT based on the comparison result. The value UP_OUT<0:C> will be described later in detail with reference to FIG. 5. In the case where UP_OUT<0:C> has a value equal to or greater than REF<0:C> (or in the case where UP_OUT<0:C> is larger than REF<0:C>), since the number of activations of a word line is equal to or greater than the reference number, the alert signal ALERT is activated. In the case where UP_OUT<0:C> is smaller than REF<0:C>, the alert signal ALERT is deactivated. The information REF<0:C> on the reference number may be a value that is set in advance in the memory 310 or a value that is inputted from an external source other than the memory 310 and is stored in the memory 310. The value may be differently set according to operation circumstances of a memory, performance of the memory, etc.

The alert signal ALERT may be transferred to the memory controller 320. The memory controller 320 may control the memory 310 to immediately perform the special refresh operation when the alert signal ALERT is activated, or may control the memory 310 to perform the special refresh operation when a predetermined time lapses after the alert signal ALERT is activated.

The address storage unit 430 stores the address ADD<0:A> when the alert signal ALERT is activated. That is to say, if the alert signal ALERT is activated, the address storage unit 430 stores an address ADD<0:A>, which corresponds to a currently activated word line. Activation of the alert signal ALERT suggests that the address ADD<0:A> corresponding to the currently activated word line corresponds to the excessive address. In the case of performing the special refresh operation, since the memory controller 320 needs an excessive address, the memory 310 stores the excessive address in the address storage unit 430 and may transfer the excessive address to the memory controller 320 depending on certain situations.

In the memory in accordance with the embodiment of the present invention, the numbers of activations of respective word lines are stored using memory cells, which are connected to the corresponding word lines. At this time, when a fail occurs in a memory cell, which stores the number of activations of a word line or a bit line to which such a memory cell is connected, the special refresh operation may not be properly performed. Therefore, in the memory in accordance with the embodiment of the present invention, redundancies are provided in memory cells for storing the numbers of activations of word lines and bit lines to which the memory cells are connected, a bit line (or a memory cell) in which a fail has occurred is detected through a test, and the numbers of activations of the word lines are stored in memory cells, which are connected to bit lines excluding the detected bit line, whereby the special refresh operation may be normally performed.

Figure 5:
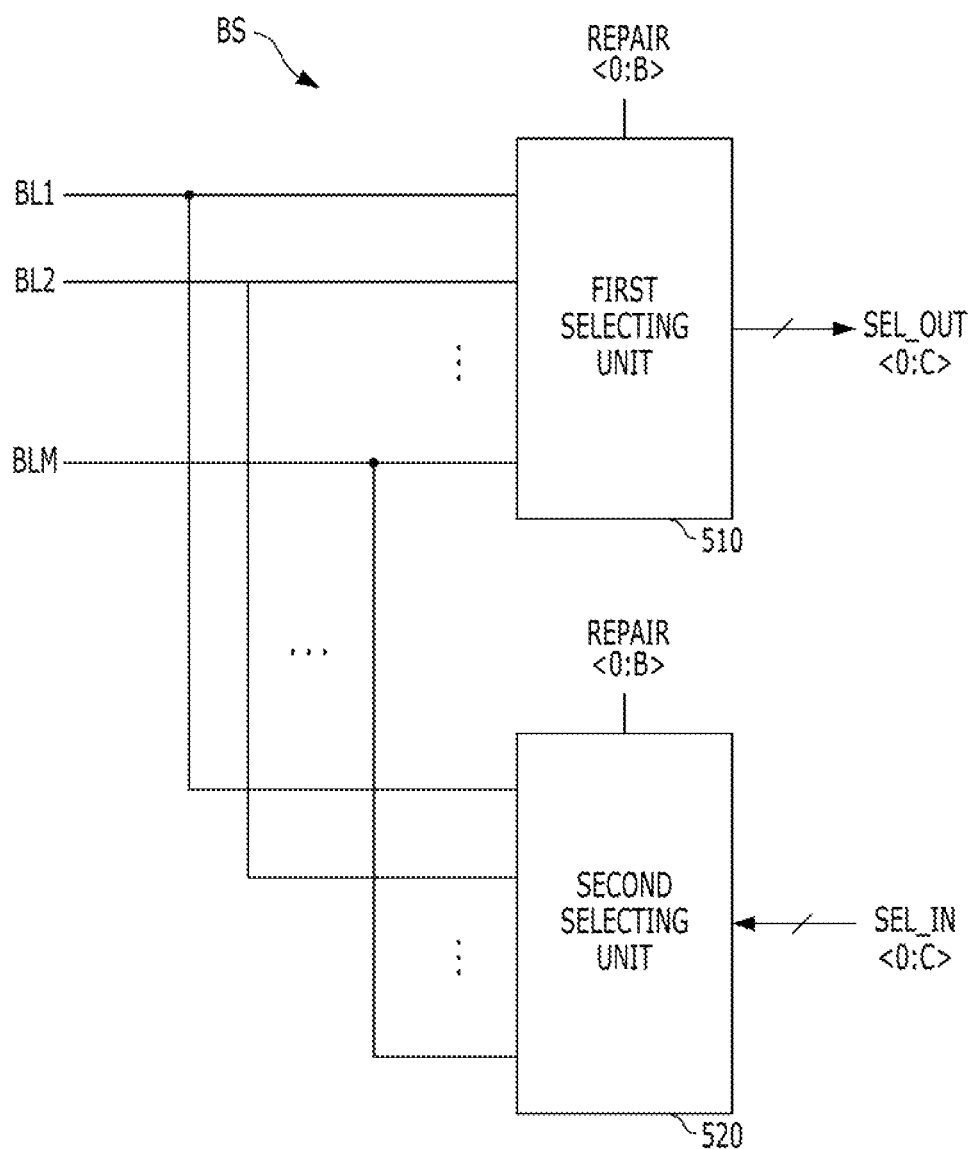
FIG. 5 is a detailed diagram illustrating a bit line selection unit shown in FIG. 4.

FIG. 5 is a detailed diagram illustrating the bit line selection unit BS shown in FIG. 4.

Referring to FIG. 5, the bit line selection unit BS includes a first selecting unit 510 and a second selecting unit 520. The first selecting unit 510 may select one or more bit lines among the first to $M^{th}$ bit lines BL1 to BLM based on the repair information REPAIR<0:B> and transfer a value transferred through the one or more selected bit lines, as output information SEL_OUT<0:C>. The second selecting unit 520 may select one or more bit lines among the first to $M^{th}$ bit lines BL1 to BLM based on the repair information REPAIR<0:B> and transfer input information SEL_IN<0:C> to the one or more selected bit lines. The output information SEL_OUT<0:C> is a value, which is transferred from the bit line selection unit BS to the stored value updating unit 412, and the input information SEL_IN<0:C> is a value, which is transferred from the stored value updating unit 412 to the bit line selection unit BS.

The repair information REPAIR<0:B> includes information on the address of a bit line in which a fail has occurred. The first selecting unit 510 selects one or more bit lines among the first to $M^{th}$ bit lines BL1 to BLM in which no fail has occurred, based on the repair information REPAIR<0:B>, and the second selecting unit 520 selects the same bit lines as the first selecting unit 510.

Figure 6:
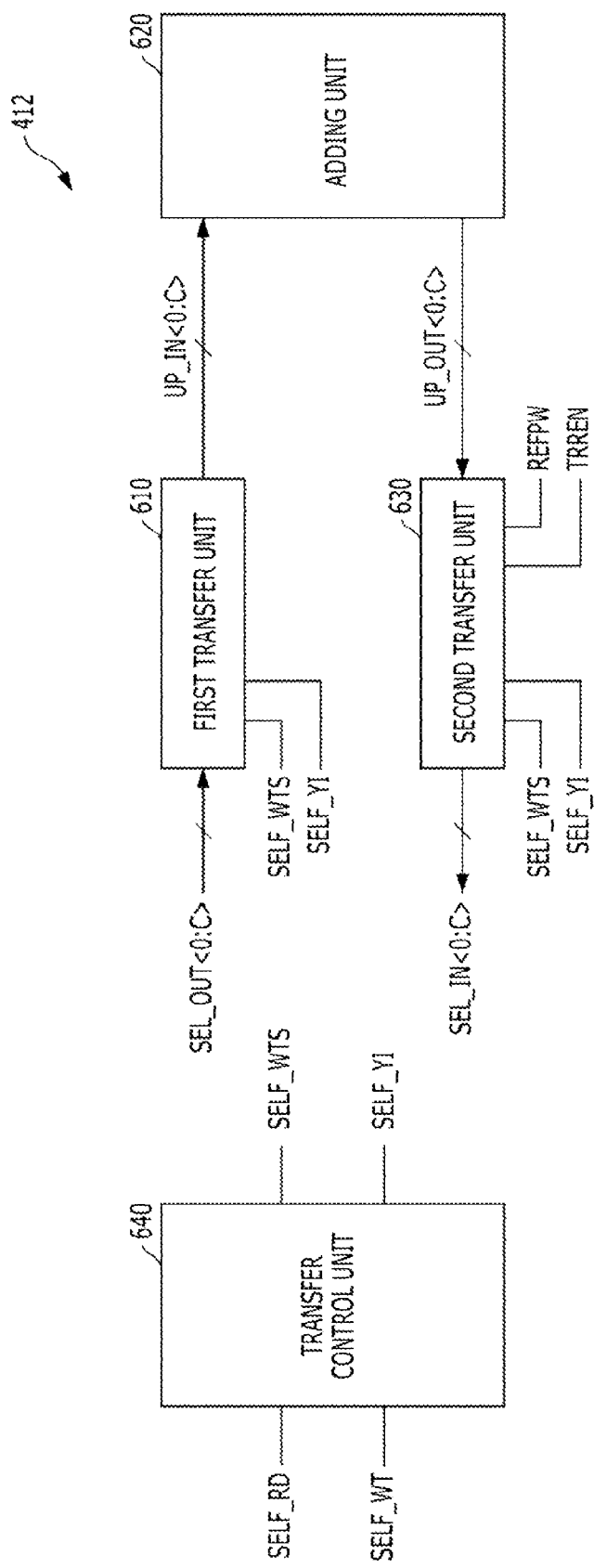
FIG. 6 is a detailed diagram illustrating a stored value updating unit shown in FIG. 4.

FIG. 6 is a detailed diagram illustrating the stored value updating unit 412 shown in FIG. 4.

Referring to FIG. 6, the stored value updating unit 412 includes an adding unit 620 that may increase a value inputted through the input terminal thereof by a predetermined value and output an increased value through the output terminal thereof, a first transfer unit 610 that may transfer the value SEL_OUT<0:C> outputted from the bit line selection unit BS to the input terminal of the adding unit 620 when the first transfer signal SELF_RD is activated, a second transfer unit 630 that may transfer the value outputted from the output terminal of the adding unit 620 to the bit line selection unit BS when the second transfer signal SELF_WT is activated, and a transfer control unit 640 that may control the first transfer unit 610 and the second transfer unit 630 based on the first transfer signal SELF_RD and the second transfer signal SELF_WT.

The stored value updating unit 412 will be described below in detail with reference to FIG. 6.

The transfer control unit 640 generates a period signal SELF_WTS and a strobe signal SELF_YI based on the first transfer signal SELF_RD and the second transfer signal SELF_WT. The period signal SELF_WTS is a signal, which denotes a period in which a value stored in a second memory cell C2 connected to a currently activated word line is to be outputted or a period in which an updated value is to be stored in the second memory cell C2.

When the period signal SELF_WTS is activated (to a high level), it represents a period in which an updated value is to be stored in a second memory cell C2, and, when the period signal SELF_WTS is deactivated (to a low level), it represents a period in which a value stored in a second memory cell C2 connected to an activated word line is to be outputted. The transfer control unit 640 deactivates the period signal SELF_WTS when the first transfer signal SELF_RD is activated, and activates the period signal SELF_WTS when the second transfer signal SELF_WT is activated. Also, the transfer control unit 640 activates the strobe signal SELF_YI for a predetermined period when the first transfer signal SELF_RD or the second transfer signal SELF_WT is activated.

The first transfer unit 610 transfers the value SEL_OUT<0:C> transferred from the bit line selection unit BS as a signal UP_IN<0:C> of the input terminal of the adding unit 620 when the first transfer signal SELF_RD is activated. In detail, the first transfer unit 610 transfers the value SEL_OUT<0:C>, which is selected by the bit line selection unit BS, in a value outputted from a plurality of second memory cells C2, which are connected to an activated word line, as the signal UP_IN<0:C> of the input terminal of the adding unit 620, based on the period signal SELF_WTS and the strobe signal SELF_YI. The first transfer unit 610 transfers the value SEL_OUT<0:C> transferred from the bit line selection unit BS as the signal UP_IN<0:C> if the strobe signal SELF_YI is activated when the period signal SELF_WTS is deactivated.

The adding unit 620 generates a value UP_OUT<0:C> by adding the predetermined value to the value of the signal UP_IN<0:C>, which is inputted to the input terminal thereof, and outputs the value UP_OUT<0:C> through the output terminal thereof. The adding unit 620 may be an adder generally known in the art, which generates a value by adding '1' to an inputted value.

The second transfer unit 630 transfers the value UP_OUT<0:C> as the value SEL_IN<0:C> to be transferred to the bit line selection unit BS when the second transfer signal SELF_WT is activated, or the second transfer unit 630 initializes the value SEL_IN<0:C>. In detail, the second transfer unit 630 transfers the value UP_OUT<0:C> as the value SEL_IN<0:C> if the strobe signal SELF_YI is activated when the period signal SELF_WTS is activated when both signals REFPW and TRREN described above with reference to FIG. 4 are deactivated. Conversely, the second transfer unit 630 initializes the value SEL_IN<0:C> when the strobe signal SELF_YI is activated when the period signal SELF_WTS is activated when one of the two signals REFPW and TRREN is activated.

A memory core circuit in accordance with an embodiment of the present invention will be described below with reference back to FIG. 4.

Referring to FIG. 4, a memory core circuit includes a first cell array CA1 including a plurality of first memory cells C1, which are connected to first to $N^{th}$ word lines WL1 to WLN, a bit line selection unit BS that may select at least one bit line among first to $M^{th}$ bit lines BL1 to BLM based on repair information REPAIR<0:B>, and a second cell array CA2 including a plurality of second memory cells C2, which are connected to first to $N^{th}$ word lines WL1 to WLN, are connected to the first to $M^{th}$ bit lines BL1 to BLM and store the numbers of activation of word lines connected to them among the first to $N^{th}$ word lines WL1 to WLN when bit lines connected to them are selected.

A method for storing the numbers of activations of word lines in the second cell array CA2 of the memory core circuit and updating the numbers of activations of word lines is substantially the same as described above with reference to FIGS. 3 and 4.

In the memory core circuit in accordance with the embodiment of the present invention, redundancies are provided in memory cells for storing the numbers of activations of word lines and bit lines to which the memory cells are connected, a bit line (or a memory cell) in which a fail has occurred is detected through a test, and the numbers of activations of the word lines are stored in memory cells, which are connected to bit lines excluding the detected bit line, whereby the special refresh operation may be normally performed.

As is apparent from the above descriptions, in the embodiment of the present invention, the numbers of activations of respective word lines are counted by storing the numbers of activation of the respective word lines in memory cells connected to the respective word lines, and a fail occurred in the memory cells storing the numbers of activations of the respective word lines may be repaired, whereby it may be possible to prevent the occurrence of a concern in counting the numbers of activations of word lines.

Figure 7:
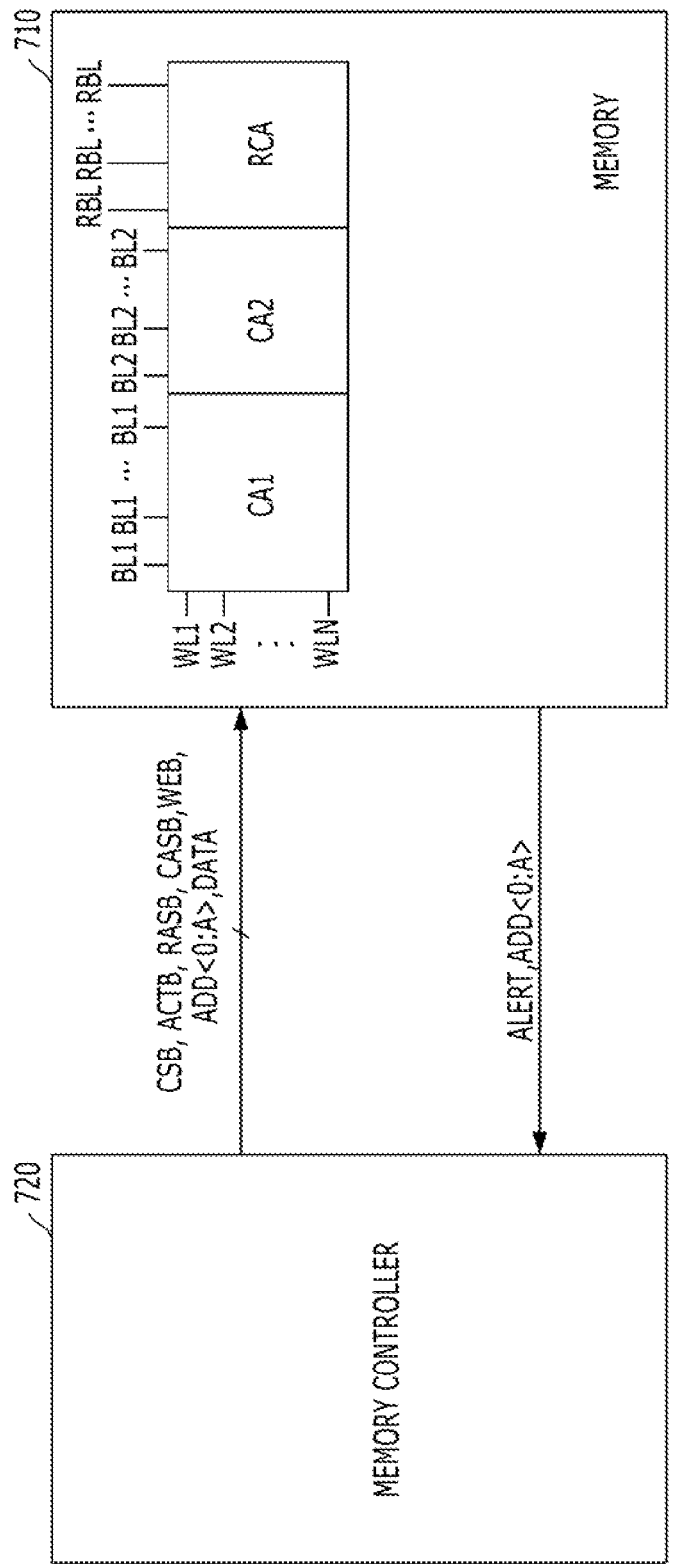
FIG. 7 is a configuration diagram illustrating a memory system in accordance with another embodiment of the present invention.

FIG. 7 is a configuration diagram illustrating a memory system in accordance with another embodiment of the present invention.

Referring to FIG. 7, a memory system includes a memory 710 and a memory controller 720. The memory 710 includes a first cell array CA1 including a plurality of first memory cells (shown in FIG. 8), which are connected to first to $N^{th}$ word lines WL1 to WLN, a second cell array CA2 including a plurality of second memory cells (shown in FIG. 8), which are connected to the first to $N^{th}$ word lines WL1 to WLN, are connected to one or more bit lines BL2 and store the numbers of activations of word lines connected to them among the first to $N^{th}$ word lines WL1 to WLN, and a redundancy cell array RCA including a plurality of redundancy memory cells (shown in FIG. 8), which are connected to the first to $N^{th}$ word lines WL1 to WLN, are connected to one or more redundancy bit lines RBL for replacing one or more bit lines BL2 and store the numbers of activations of word lines connected to them among the first to $N^{th}$ word lines WL1 to WLN when the one or more bit lines BL2 are replaced. The memory 710 may generate an alert signal ALERT when any of the numbers of activations of the first to $N^{th}$ word lines WL1 to WLN is equal to or greater than a reference number. The memory controller 720 may supply an excessive address corresponding to a word line (i.e., the frequently activated word line) of which the number of activations is equal to or greater than the reference number, among the first to $N^{th}$ word lines WL1 to WLN, and at least one adjacent address with a value adjacent to the excessive address to the memory 710. For example, when an excessive address corresponding to a word line of which the number of activations is equal to or greater than the reference number is '5', adjacent addresses may have a value of '4' or '6'.

For reference, the memory controller 720 inputs command signals including a chip select signal CSB, an active signal ACTB, a row address strobe signal RASB, a column address strobe signal CASB, and a write enable signal WEB to the memory 710. The fact that the memory controller 720 applies a specific command to the memory 710 means that a combination of the command signals CSB, ACTB, RASB, CASB and WEB corresponds to the specific command. For example, application of an active command from the memory controller 720 to the memory 710 suggests that a combination of the command signals CSB, ACTB, RASB, CASB and WEB applied by the memory controller 720 to the memory 710 corresponds to the active command. A command decoder (not shown in FIG. 7) included in the memory 710 decodes the command signals CSB, ACTB, RASB, CASB and WEB and internally generates a command of the memory 710. Also, the memory controller 720 applies an address ADD<0:A>, data DATA, and so forth to the memory 710 in addition to the plurality of command signals CSB, ACTB, RASB, CASB and WEB, for operations of the memory 710.

Hereafter, the special refresh mode represents an operation mode in which a word line adjacent to a word line with the number of activations equal to or greater than the reference number is activated and the data of a plurality of memory cells connected to the word line adjacent to the word line with the number of activations equal to or greater than the reference number are refreshed.

The memory system will be described below in detail with reference to FIG. 7.

The first cell array CA1 includes the plurality of first memory cells, which are connected to the first to $N^{th}$ word lines WL1 to WLN. The first memory cells are memory cells for storing general data, which are inputted to and outputted from the memory 710. The second cell array CA2 includes the plurality of second memory cells, which are connected to the first to $N^{th}$ word lines WL1 to WLN in a row direction and are connected to the one or more bit lines BL2 in a column direction. The redundancy cell array RCA includes the plurality of redundancy memory cells, which are connected to the first to $N^{th}$ word lines WL1 to WLN in the row direction and are connected to the one or more redundancy bit lines RBL for replacing the one or more bit lines BL2 in the column direction. When one or more bit lines BL2 are not replaced, the number of activations of a $K^{th}$ word line WLK is stored in a plurality of second memory cells, which are connected to the $K^{th}$ word line WLK, and, when one or more bit lines BL2 are replaced, the number of activations of the $K^{th}$ word line WLK is stored in a plurality of redundancy memory cells, which are connected to the $K^{th}$ word line WLK.

The memory 710 checks whether there is a failed bit line among the one or more bit lines BL2, through a test operation, and stores whether the one or more bit lines BL2 are failed or not according to a test result. When a fail does not occur in the one or more bit lines BL2, the memory 710 does not replace the one or more bit lines BL2 and stores the numbers of activations of the word lines in the plurality of second memory cells, which are connected to the word lines. Conversely, when falls occur in the one or more bit lines BL2, the memory 710 replaces the one or more bit lines BL2 and stores the numbers of activation of the word lines in the plurality of redundancy memory cells, which are connected to the word lines.

An occurrence of fail in a bit line suggests that a fail has occurred in a second memory cell connected to the bit line or a fail has occurred in the bit line itself or a peripheral circuit of the bit line so that an operation for writing data in the second memory cell connected to the corresponding bit line or reading data from the second memory cell may not be normally performed.

Hereinbelow, an exemplary process for the memory 710 to store the numbers of activations of the first to $N^{th}$ word lines WL1 to WLN in the second cell array CA2 or the redundancy cell array RCA and update the values stored in the second cell array CA2 or the redundancy cell array RCA will be described.

The memory 710 decodes the plurality of command signals CSB, ACTB, RASB, CASB and WEB, which are applied from the memory controller 720, and generates an active command for activating a word line, a precharge command for precharging a word line, a refresh command for performing a normal refresh operation for a memory cell, a read command for reading data of a memory cell, a write command for writing data in a memory cell, and an MRS (mode register set) command for setting a mode register set.

The memory 710 updates a value stored in a plurality of second memory cells, which are connected to an activated word line, and, in the case where at least one bit line BL2 is replaced, the memory 710 updates a value stored in a plurality of redundancy memory cells, which are connected to an activated word line. In detail, the memory 710 (1) increases a value stored in a plurality of second memory cells connected to an activated word line (or increases a value stored in a plurality of redundancy memory cells connected to an activated word line when at least one bit line BL2 is replaced), in the case of activating a word line corresponding to an address ADD<0:A> based on an active command, and (2) initializes a value stored in a plurality of second memory cells connected to an activated word line (or initializes a value stored in a plurality of redundancy memory cells connected to an activated word line when at least one bit line BL2 is replaced), in the case of performing a normal refresh operation or a special refresh operation. Initialization means that a value (that is, the stored number of activations of a word line) stored in second memory cells or redundancy memory cells, which are connected to one or more selected bit lines is controlled to have a value corresponding to when the number of activations is 0.

(1) Case of Increasing a Value Stored in a Plurality of Second Memory Cells or a Plurality of Redundancy Memory Cells To perform the special refresh operation described above with reference to FIG. 2, it may be necessary to detect an excessive address. Therefore, the numbers of activations of respective word lines should be counted based on the active command. Accordingly, when a word line corresponding to an address ADD<0:A> is activated based on the active command, the memory 710 increases a value stored in a plurality of second memory cells, which are connected to the activated word line. When at least one bit line BL2 is replaced, the memory 710 increases a value stored in a plurality of redundancy memory cells, which are connected to the activated word line.

In detail, since a plurality of second memory cells and a plurality of redundancy memory cells, which are connected to the activated word line are electrically connected to the bit lines BL2 and the redundancy bit lines RBL corresponding to them, data are transferred between the second memory cells and the redundancy memory cells connected to the activated word line and the bit lines BL2 and the redundancy bit lines RBL. The memory 710 increases the value outputted from the plurality of second memory cells connected to the activated word line by '1' based on the active command, and stores the increased value in the plurality of second memory cells, which are connected to the activated word line. That is to say, since the value stored in the plurality of second memory cells is increased by '1' each time a word line connected to them is activated, the value becomes a binary value corresponding to the number of activations of the word line. When at least one bit line BL2 is replaced, the memory 710 increases the value outputted from the plurality of redundancy memory cells connected to the activated word line by '1' based on the active command, and stores the increased value in the plurality of redundancy memory cells, which are connected to the activated word line. Accordingly, in this case, the value stored in the plurality of redundancy memory cells becomes a binary value corresponding to the number of activations of the word line connected to them.

Further, when the value stored in the plurality of second memory cells connected to the activated word line is equal to or greater than the reference number or the value stored in the plurality of redundancy memory cells connected to the activated word line when at least one bit line BL2 is replaced is equal to or greater than the reference number, the memory 710 activates the alert signal ALERT, which notifies that it may be necessary to perform the special refresh operation. The memory 710 may store the address ADD<0:A>, which is supplied to the memory 710 when the alert signal ALERT is activated.

When the alert signal ALERT is activated, the memory controller 720 may control the memory 710 to perform the special refresh operation described above in detail with reference to FIG. 2. The memory controller 720 may control the memory 710 to enter the special refresh mode immediately when the alert signal ALERT is activated, or may control the memory 710 to enter the special refresh mode when a preset time lapses after the alert signal ALERT is activated. The memory 710 operates in the special refresh mode from a time when it enters the special refresh mode to a time when it exits the special refresh mode.

(2) Case of Initializing a Value Stored in a Plurality of Second Memory Cell or a Plurality of Redundancy Memory Cells When the memory 710 refreshes the data of a plurality of first memory cells, which are connected to a word line activated among the first to $N^{th}$ word lines WL1 to WLN included in the memory 710 in the normal refresh operation, the numbers of activations of respective word lines should be re-counted from initial states, and a word line of which the number of activations is equal to or greater than the reference number should be detected. Also, when a specific word line is activated over the reference number and thus the special refresh operation is performed for a word line adjacent to the specific word line, the number of activations of the specific word line should be re-counted from an initial state, and a word line of which the number of activations is equal to or greater than the reference number should be detected.

Therefore, when the data of a plurality of first memory cells connected to an activated word line are refreshed in the normal refresh operation or the special refresh operation, the memory 710 initializes a value stored in the plurality of second memory cells, which are connected to the activated word line or a value stored in the plurality of redundancy memory cells, which are connected to the activated word line when at least one bit line BL2 is replaced.

For reference, the reason to initialize a value stored in the plurality of second memory cells or the plurality of redundancy memory cells, which are connected to the activated word line, in the normal refresh operation, resides in that, since a plurality of word lines are sequentially activated in the normal refresh operation, a word line adjacent to an activated word line is immediately activated and the data of a plurality of first memory cells, which are connected to the adjacent word line are refreshed, and, therefore, because word line disturbance does not occur, it may be not necessary to immediately perform the special refresh operation.

In detail, in the normal refresh operation, the memory 710 initializes a value outputted from the plurality of second memory cells, which are connected to the activated word line, to '0', and stores the initialized value in the plurality of second memory cells, which are connected to the activated word line. When at least one bit line BL2 is replaced, the memory 710 initializes a value outputted from the plurality of redundancy memory cells, which are connected to the activated word line, to '0', and stores the initialized value in the plurality of redundancy memory cells, which are connected to the activated word line.

In the special refresh operation, the memory 710 initializes a value outputted from the plurality of second memory cells, which are connected to a first activated word line (a word line corresponding to an excessive address) in a compensation cycle, to '0', and stores the initialized value in the plurality of second memory cells, which are connected to the activated word line. When at least one bit line BL2 is replaced, the memory 710 initializes a value outputted from the plurality of redundancy memory cells, which are connected to a first activated word line (a word line corresponding to an excessive address) in a compensation cycle, to '0', and stores the initialized value in the plurality of redundancy memory cells, which are connected to the activated word line.

Operations of the memory system in the special refresh operation will be described below with reference to FIG. 7.

When the alert signal ALERT is activated, the memory controller 720 controls the memory 710 to enter the special refresh mode by a combination of the plurality of command signals CSB, ACTB, RASB, CASB and WEB and the address ADD<0:A>. If the memory 710 enters the special refresh mode, the memory controller 720 sequentially supplies an excessive address L and addresses L+1 and L−1 corresponding to word lines adjacent to a word line corresponding to the excessive address L, along with the active command ACT. The memory 710 activates the $L^{th}$ word line WLL, the $L+1^{th}$ word line WLL+1 and the $L-1^{th}$ word line WLL−1, which respectively correspond to the addresses L, L+1 and L−1, based on the active command ACT. When the special refresh operation is completed, the memory controller 720 controls the memory 710 to exit the special refresh mode by a combination of the plurality of command signals CSB, ACTB, RASB, CASB and WEB and the address ADD<0:A>. The memory 710 may also automatically exit the special refresh mode when the three active operations are completed.

In the memory system in accordance with the embodiment of the present invention, the numbers of activations of respective word lines are stored using memory cells, which are connected to the corresponding word lines. At this time, when a fail occurs in a memory cell, which stores the number of activations of a word line or a bit line to which such a memory cell is connected, the special refresh operation may not be properly performed. Therefore, the memory system in accordance with the embodiment of the present invention has bit lines and memory cells for storing the numbers of activations of word lines and redundancy bit lines and redundancy memory cells for replacing bit lines or memory cells in which fails occur, such that a bit line determined through a test to have a fail is replaced with a redundancy bit line and the number of activation of a word line is stored in redundancy memory cells, whereby the special refresh operation may be smoothly performed.

Figure 8:
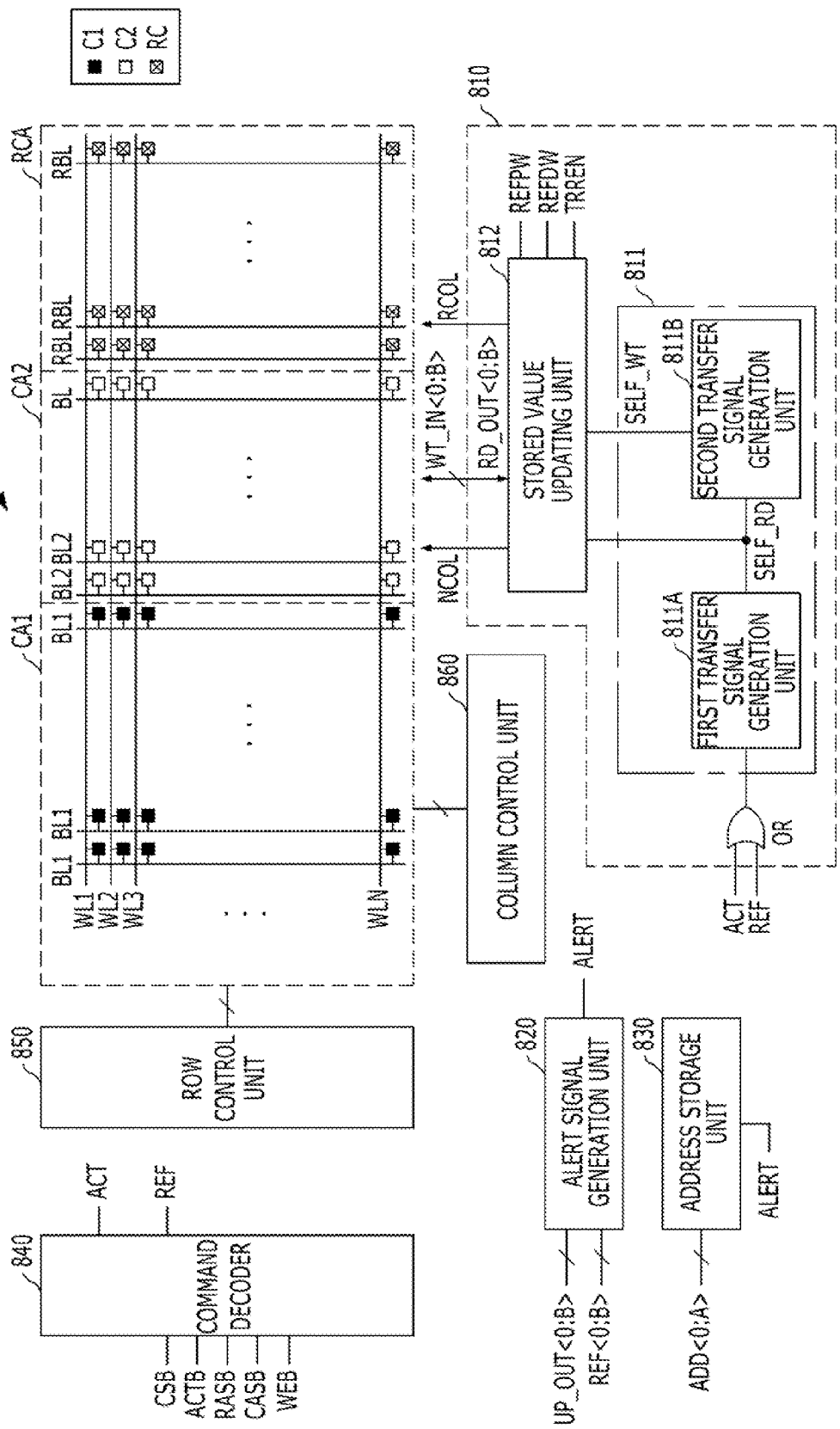
FIG. 8 is a configuration diagram illustrating a memory in accordance with another embodiment of the present invention.

FIG. 8 is a configuration diagram illustrating the memory 710 in accordance with another embodiment of the present invention.

Referring to FIG. 8, the memory 710 includes a first cell array CA1 including a plurality of first memory cells C1, which are connected to first to $N^{th}$ word lines WL1 to WLN, a second cell array CA2 including a plurality of second memory cells C2, which are connected to the first to $N^{th}$ word lines WL1 to WLN and are connected to one or more bit lines BL2 and store the numbers of activations of word lines connected to them among the first to $N^{th}$ word lines WL1 to WLN, a redundancy cell array RCA including a plurality of redundancy memory cells RC, which are connected to the first to $N^{th}$ word lines WL1 to WLN and are connected to one or more redundancy bit lines RBL for replacing one or more bit lines BL2 and store the numbers of activations of word lines connected to them among the first to $N^{th}$ word lines WL1 to WLN when the one or more bit lines BL2 are replaced, an activation number update unit 810 that may update a value stored in the plurality of second memory cells C2, which are connected to a word line activated among the first to $N^{th}$ word lines WL1 to WLN and replace a value stored in the plurality of redundancy memory cells RC, which are connected to an activated word line when at least one bit line BL2 is replaced, an alert signal generation unit 820 that may activate an alert signal ALERT when the number of activation of a word line corresponding to an address ADD<0:A> stored in the plurality of second memory cells C2 connected to a word line corresponding to the address ADD<0:A> or in the plurality of redundancy memory cells RC connected to a word line corresponding to the address ADD<0:A>, is equal to or greater than a reference number, and an address storage unit 830 that may store the address ADD<0:A> when the alert signal ALERT is activated.

Further, the memory 710 includes a command decoder 840 that may decode the command signals CSB, ACTB, RASB, CASB and WEB inputted from the memory controller 720 and generate an active command ACT, a precharge command (not shown in FIG. 8), a refresh command REF, a read command (not shown in FIG. 8), a write command (not shown in FIG. 8), an MRS command (not shown in FIG. 8), and so forth. The memory 710 also includes bit lines BL1 and BL2 and redundancy bit lines RBL connected to respective memory cells, a row control unit 850 that may control row operations of the cell arrays CA1 and CA2 and the redundancy cell array RCA, and a column control unit 860 that may control column operations of the first cell array CA1.

The memory 710 will be described below in detail with reference to FIG. 8.

Data to be inputted to and outputted from the memory 710 are stored in the first cell array CA1, and the numbers of activations of the first to $N^{th}$ word lines WL1 to WLN are stored in the second cell array CA2 or in the redundancy cell array RCA when at least one bit line BL2 is replaced. The row control unit 850 activates at least one word line among the first to $N^{th}$ word lines WL1 to WLN when the active command ACT, the refresh command REF, and so forth are supplied thereto. The column control unit 860 performs an operation necessary to read and output data unitially or entirely from a plurality of first memory cells C1, which are connected to an activated word line or write data unitially or entirely in a plurality of first memory cells C1, which are connected to an activated word line. Since operations of reading and writing data from and to the first cell array CA1, that is, a conventional cell array for storing data, are generally known in the art and are not directly associated with the embodiment of the present invention, detailed descriptions thereof will be omitted herein.

The activation number update unit 810 updates a value stored in a plurality of second memory cells C2, which are connected to an activated word line, and updates a value stored in a plurality of redundancy memory cells RC, which are connected to an activated word line when at least one bit line BL2 is replaced. (1) In the case of activating a word line corresponding to an address ADD<0:A> based on the active command ACT, the activation number update unit 810 increases a value stored in a plurality of second memory cells C2, which are connected to an activated word line, and increases a value stored in a plurality of redundancy memory cells RC, which are connected to an activated word line when at least one bit line BL2 is replaced. (2) In the case of activating a word line while performing the normal refresh operation or the special refresh operation, the activation number update unit 810 initializes a value stored in a plurality of second memory cells C2, which are connected to an activated word line, and initializes a value stored in a plurality of redundancy memory cells RC, which are connected to an activated word line when at least one bit line BL2 is replaced. Initialization means that the number of activations stored in the plurality of second memory cells C2 or the plurality of redundancy memory cells RC, which are connected to the activated word line is set to '0'.

(1) Case of Increasing a Value Stored in a Plurality of Second Memory Cells C2 or a Plurality of Redundancy Memory Cells RC, which are Connected to an Activated Word Line The activation number update unit 810 reads a value stored in a plurality of second memory cells C2, which are connected to an activated word line, when a predetermined time (a first time) has lapsed after the active command ACT is supplied. The activation number update unit 810 increases a value RD_OUT<0:B> read from the plurality of second memory cells C2 by '1' and transfers an increased value WT_IN<0:B> to at least one bit line BL2. The value transferred to the at least one bit line BL2 is written in the plurality of second memory cells C2, which are connected to the activated word line.

When at least one bit line BL2 is replaced, the activation number update unit 810 reads a value stored in the plurality of redundancy memory cells RC, which are connected to an activated word line, instead of a value stored in the plurality of second memory cells C2, which are connected to the activated word line, increases a read value RD_OUT<0:B> by '1', and transfers an increased value WT_IN<0:B> to at least one redundancy bit line RBL. The value transferred to the at least one redundancy bit line RBL is written in a plurality of redundancy memory cells RC, which are connected to the activated word line.

In detail, the activation number update unit 810 generates a normal column signal NCOL and a redundancy column signal RCOL based on the active command ACT and a redundancy signal RED. The redundancy signal RED represents whether at least one bit line BL2 is replaced. When the redundancy signal RED is deactivated, it represents that at least one bit line BL2 is not replaced, and, when the redundancy signal RED is activated, it represents that at least one bit line BL2 is replaced. When the redundancy signal RED is deactivated, the activation number update unit 810 firstly activates the normal column signal NCOL when a first time has lapsed after the active command ACT is supplied, and secondly activates the normal column signal NCOL when a second time has lapsed after the normal column signal NCOL is firstly activated. Furthermore, when the redundancy signal RED is activated, the activation number update unit 810 firstly activates the redundancy column signal RCOL when a first time has lapsed after the active command ACT is supplied, and secondly activates the redundancy column signal RCOL when a second time has lapsed after the redundancy column signal RCOL is firstly activated.

In the case where the normal column signal NCOL is firstly activated, the second cell array CA2 outputs the value stored in the plurality of second memory cells C2, which are connected to the activated word line, to at least one bit line BL2. In the case where the normal column signal NCOL is secondly activated, the second cell array CA2 stores the value transferred to the at least one bit line BL2, in the plurality of second memory cells C2, which are connected to the activated word line.

In the case where the redundancy column signal RCOL is firstly activated, the redundancy cell array RCA outputs the value stored in the plurality of redundancy memory cells RC, which are connected to the activated word line, to at least one redundancy bit line RBL. In the case where the redundancy column signal RCOL is secondly activated, the redundancy cell array RCA stores the value transferred to the at least one redundancy bit line RBL, in the plurality of redundancy memory cells RC, which are connected to the activated word line.

(2) Case of Initializing a Value Stored in a Plurality of Second Memory Cells C2 or a Plurality of Redundancy Memory Cells RC, which are Connected to an Activated Word Line In the case where the memory 710 performs the normal refresh operation, the activation number update unit 810 reads a value stored in a plurality of second memory cells C2, which are connected to an activated word line, when a predetermined time (a first time) has lapsed after the refresh command REF is supplied. The activation number update unit 810 initializes a value RD_OUT<0:B> read from the plurality of second memory cells C2, to an initial value (for example, '0'), and transfers an initialized value WT_IN<0:B> to at least one bit line BL2. The value transferred to the at least one bit line BL2 is written in the plurality of second memory cells C2, which are connected to the activated word line.

When at least one bit line BL2 is replaced, the activation number update unit 810 reads a value stored in a plurality of redundancy memory cells RC, which are connected to an activated word line, instead of a plurality of second memory cells C2, which are connected to an activated word line, initializes a read value RD_OUT<0:B> to an initial value, and transfers an initialized value WT_IN<0:B> to at least one redundancy bit line RBL. The value transferred to the at least one redundancy bit line RBL is written in the plurality of redundancy memory cells RC, which are connected to the activated word line.

Moreover, in the case where the memory 710 performs the special refresh operation, the activation number update unit 810 reads a value stored in a plurality of second memory cells C2, which are connected to a word line activated based on the active command ACT, when a first time has lapsed after the active command ACT is supplied. The activation number update unit 810 initializes a value RD_OUT<0:B> read from the plurality of second memory cells C2, to an initial value (for example, '0'), and transfers an initialized value WT_IN<0:B> to at least one bit line BL2. The value transferred to the at least one bit line BL2 is written in the plurality of second memory cells C2, which are connected to the activated word line. When at least one bit line BL2 is replaced, a value stored in a plurality of redundancy memory cells RC, which are connected to an activated word line is initialized in substantially the same way as the case of performing the normal refresh operation.

In detail, the activation number update unit 810 generates a normal column signal NCOL and a redundancy column signal RCOL based on the active command ACT or the refresh command REF and a redundancy signal RED. The procedure for the activation number update unit 810 to generate the normal column signal NCOL and the redundancy column signal RCOL is substantially the same in the case where the active command ACT is supplied and in the case where the refresh command REF is supplied. The procedure for generating the normal column signal NCOL and the redundancy column signal RCOL in the case where the active command ACT is supplied and operations performed by the second cell array CA2 and the redundancy cell array RCA based on the normal column signal NCOL and the redundancy column signal RCOL are substantially the same as described above.

If the normal column signal NCOL is activated, the value stored in the plurality of second memory cells C2 included in the second cell array CA2 is updated, and, if the redundancy column signal RCOL is activated, the value stored in the plurality of redundancy memory cells RC included in the redundancy cell array RCA is updated.

For the above-described operations, the activation number update unit 810 includes a transfer signal generating unit 811 and a stored value updating unit 812.

The transfer signal generating unit 811 may activate a first transfer signal SELF_RD based on the active command ACT or the refresh command REF, and activate a second transfer signal SELF_WT when a predetermined time lapses after the first transfer signal SELF_RD is activated.

In detail, the transfer signal generating unit 811 activates the first transfer signal SELF_RD after a first time lapses from a time when the active command ACT or the refresh command REF is supplied from the command decoder 840. The first time may be tRCD (RAS to CAS delay: a time during which charges of a bit line BL are sufficiently distributed after a RAS signal is activated and a bit line sense amplifier amplifies the data of the bit line BL). Next, the transfer signal generating unit 811 activates the second transfer signal SELF_WT after a second time lapses from a time when the first transfer signal SELF_RD is activated. The second time may be a time, which is required until a value outputted from a plurality of second memory cells C2 connected to an activated word line is completely updated by the stored value updating unit 812.

For these operations, the transfer signal generating unit 811 includes a first transfer signal generation unit 811A that may delay the active command ACT or the refresh command REF by the first time and generate the first transfer signal SELF_RD, and a second transfer signal generation unit 811B that may delay the first transfer signal SELF_RD by the second time and generate the second transfer signal SELF_WT. The first transfer signal generation unit 811A and the second transfer signal generation unit 811B may delay their inputs in synchronization with a clock signal or may delay their inputs in desynchronization with a clock signal.

The stored value updating unit 812 may receive and update a value outputted from a plurality of second memory cells C2, which are connected to an activated word line, based on to the first transfer signal SELF_RD, and transfer an updated value to the plurality of second memory cells C2, which are connected to the activated word line, based on the second transfer signal SELF_WT. When at least one bit line BL2 is replaced, the stored value updating unit 812 receives and updates a value outputted from a plurality of redundancy memory cells RC, which are connected to an activated word line, based on to the first transfer signal SELF_RD, and transfers an updated value to the plurality of redundancy memory cells RC, which are connected to the activated word line, based on the second transfer signal SELF_WT. The value RD_OUT<0:B> represents a value, which is outputted from a plurality of second memory cells C2 or a plurality of redundancy memory cells RC and is transferred to the stored value updating unit 812, and the value WT_IN<0:B> represents a value, which is transferred from the stored value updating unit 812 and is inputted to a plurality of second memory cells C2 or a plurality of redundancy memory cells RC connected to an activated word line.

In detail, (1) in the case of activating a word line corresponding to an address ADD<0:A> based on the active command ACT, the stored value updating unit 812 activates the normal column signal NCOL based on the active command ACT and the deactivated redundancy signal RED. When the normal column signal NCOL is firstly activated, if a value outputted from a plurality of second memory cells C2 is transferred based on the first transfer signal SELF_RD, the value is increased by '1', and, when the second transfer signal SELF_WT is activated and the normal column signal NCOL is secondly activated, an increased value is transferred to a plurality of second memory cells C2, which are connected to an activated word line.

Furthermore, the stored value updating unit 812 activates the redundancy column signal RCOL based on the active command ACT and the activated redundancy signal RED. When the redundancy column signal RCOL is firstly activated, if a value outputted from a plurality of redundancy memory cells RC is transferred based on the first transfer signal SELF_RD, the value is increased by '1', and, when the second transfer signal SELF_WT is activated and the redundancy column signal RCOL is secondly activated, an increased value is transferred to a plurality of redundancy memory cells RC, which are connected to an activated word line.

(2) In the case of performing the normal refresh operation, the stored value updating unit 812 activates the normal column signal NCOL based on the refresh command REF and the deactivated redundancy signal RED, and initializes a value transferred from a plurality of second memory cells C2, which are connected to an activated word line. At this time, a value transferred based on a refresh signal REFPW, which is activated for 'tRFC' as a refresh time during one cycle is initialized to an initial value. An initialized value is transferred to a plurality of second memory cells C2, which are connected to an activated word line, based on the second transfer signal SELF_WT and the normal column signal NCOL.

In the case of performing the special refresh operation, the stored value updating unit 812 activates the normal column signal NCOL based on the active command ACT and the deactivated redundancy signal RED, and initializes a value transferred from a plurality of second memory cells C2, which are connected to an activated word line, based on the first transfer signal SELF_RD and the normal column signal NCOL. At this time, a transferred value is initialized to an initial value based on a special refresh signal TRREN, which is activated during the special refresh operation. An initialized value is transferred to a plurality of second memory cells C2, which are connected to an activated word line, based on the second transfer signal SELF_WT and the normal column signal NCOL.

When the redundancy signal RED is activated, the stored value updating unit 812 activates the redundancy column signal RCOL instead of the normal column signal NCOL, a value stored not in a plurality of second memory cells C2 but in a plurality of redundancy memory cells RC is received and initialized, and an initialized value is transferred to a plurality of redundancy memory cells RC. This procedure is similar to the procedure of increasing a value stored in a plurality of redundancy memory cells RC and transferring an increased value to the plurality of redundancy memory cells RC in the case (1).

When a value increased or updated by the stored value updating unit 812 is stored in a plurality of second memory cells C2 or a plurality of redundancy memory cells RC, which are connected to an activated word line, the operation of counting the numbers of activations of the word lines is completed.

The alert signal generation unit 820 compares a value UP_OUT<0:B> with information REF<0:B> on the reference number, and generates the alert signal ALERT based on the comparison result. For reference, a value UP_IN<0:B> is a value before being updated by the stored value updating unit 812, and the value UP_OUT<0:B> is a value after being updated by the stored value updating unit 812. The value UP_OUT<0:B> will be described later with reference to FIG. 9. In the case where the value UP_OUT<0:B> is equal to or greater than the information REF<0:B> (or in the case where the value UP_OUT<0:B> is greater than the information REF<0:B>), since it corresponds to the case where the number of activations of a word line is equal to or greater than the reference number, the alert signal ALERT is activated to alert that data are likely to be degraded due to word line disturbance. In the case where the value UP_OUT<0:B> is smaller than the information REF<0:B>, the alert signal ALERT is deactivated. The information REF<0:B> on the reference number may be a value that is set in advance in the memory 710 or a value that is inputted from an external source other than the memory 710. The value may be differently set according to operation circumstances of a memory, performance of the memory, etc.

The alert signal ALERT may be transferred to the memory controller 720. The memory controller 720 may control the memory 710 to immediately perform the special refresh operation when the alert signal ALERT is activated, or may control the memory 710 to perform the special refresh operation when a predetermined time lapses after the alert signal ALERT is activated.

The address storage unit 830 stores the address ADD<0:A> when the alert signal ALERT is activated. If the alert signal ALERT is activated, the address storage unit 830 stores an address ADD<0:A>, which corresponds to a currently activated word line. An activation of the alert signal ALERT suggests that the address ADD<0:A> corresponding to the currently activated word line corresponds to the excessive address. In the case of performing the special refresh operation, since the memory controller 720 needs an excessive address, the memory 710 stores the excessive address in the address storage unit 830 and may transfer the excessive address to the memory controller 720 depending on certain situations.

In the memory in accordance with the embodiment of the present invention, the numbers of activations of respective word lines are stored using memory cells, which are connected to the corresponding word lines. At this time, when a fail occurs in a memory cell, which stores the number of activations of a word line or a bit line to which such a memory cell is connected, the special refresh operation may not be properly performed. Therefore, the memory in accordance with the embodiment of the present invention includes bit lines and memory cells for storing the numbers of activations of word lines and redundancy bit lines and redundancy memory cells for replacing bit lines or memory cells in which fails occur, such that bit lines determined through a test to have fails are replaced with redundancy bit lines and the numbers of activations of the word lines are stored in redundancy memory cells, whereby the special refresh operation may be normally performed.

Figure 9:
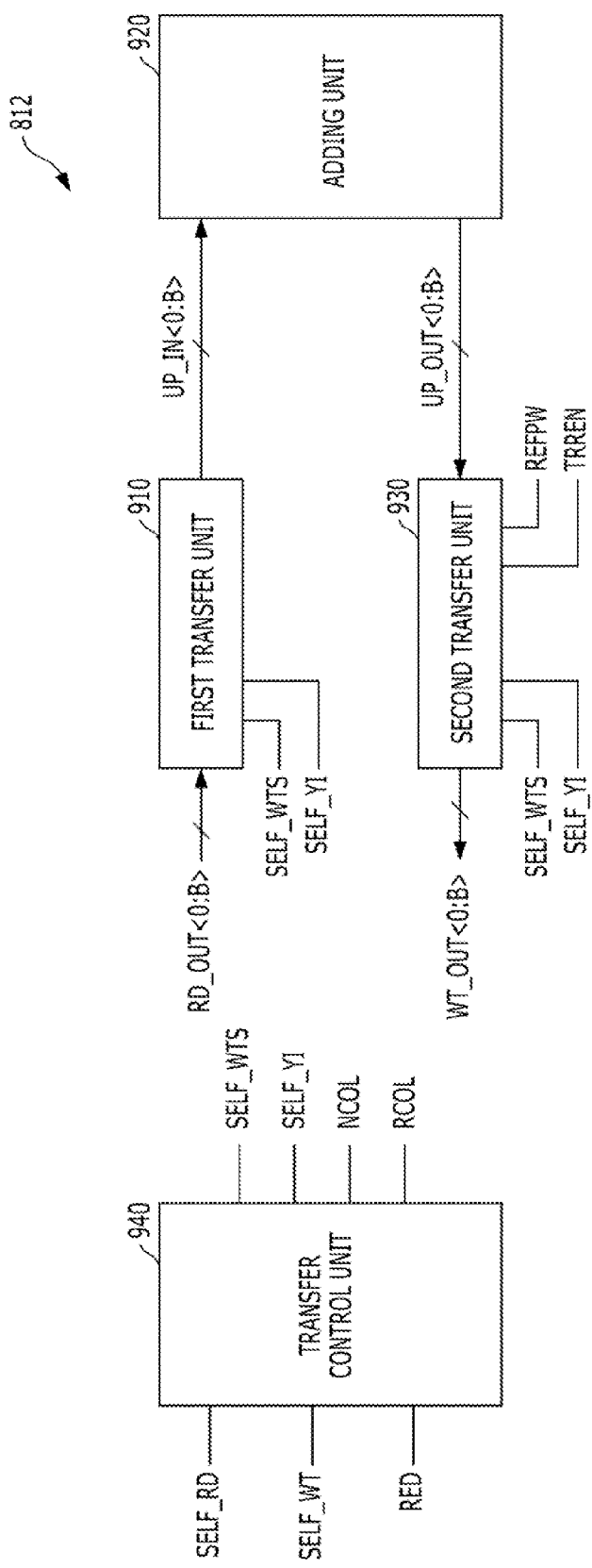
FIG. 9 is a detailed diagram illustrating a stored value updating unit shown in FIG. 8.

FIG. 9 is a detailed diagram illustrating the stored value updating unit 812 shown in FIG. 8.

Referring to FIG. 9, the stored value updating unit 812 includes an adding unit 920 that may increase a value UP_IN<0:B> inputted through the input terminal thereof and output an increased value UP_OUT<0:B> through the output terminal thereof, a first transfer unit 910 that may transfer a value outputted from a plurality of second memory cells C2 or a plurality of redundancy memory cells RC, which are connected to a word line activated among the first to $N^{th}$ word lines WL1 to WLN, to the input terminal of the adding unit 920 when the first transfer signal SELF_RD is activated, a second transfer unit 930 that may transfer the value UP_OUT<0:B> outputted from the output terminal of the adding unit 920 to the plurality of second memory cells C2 or the plurality of redundancy memory cells RC, which are connected to the activated word line when the second transfer signal SELF_WT is activated and transfer an initial value to the plurality of second memory cells C2 or the plurality of redundancy memory cells RC, which are connected to the activated word line, when the memory 710 performs the normal refresh operation, and a transfer control unit 940 that may control the first transfer unit 910 and the second transfer unit 930 based on the first transfer signal SELF_RD, the second transfer signal SELF_WT and the redundancy signal RED and may generate the normal column signal NCOL and the redundancy column signal RCOL.

The stored value updating unit 812 will be described below in detail with reference to FIG. 9.

The transfer control unit 940 generates a period signal SELF_WTS and a column signal SELF_YI based on the first transfer signal SELF_RD and the second transfer signal SELF_WT. The period signal SELF_WTS is a signal, which denotes whether it is a period in which a value stored in a plurality of second memory cells C2 or a plurality of redundancy memory cells RC connected to a currently activated word line is to be outputted or a period in which an updated value is to be stored in a plurality of second memory cells C2 or a plurality of redundancy memory cells RC. When the period signal SELF_WTS is activated (to a high level), it represents a period in which an updated value is to be stored in a plurality of second memory cells C2 or a plurality of redundancy memory cells RC, and, when the period signal SELF_WTS is deactivated (to a low level), it represents a period in which a value of a plurality of second memory cells C2 or a plurality of redundancy memory cells RC connected to an activated word line is to be outputted. The transfer control unit 940 deactivates the period signal SELF_WTS when the first transfer signal SELF_RD is activated, and activates the period signal SELF_WTS when the second transfer signal SELF_WT is activated.

Also, the transfer control unit 940 activates the column signal SELF_YI for a predetermined period when the first transfer signal SELF_RD or the second transfer signal SELF_WT is activated. The column signal SELF_YI represents that the number of activations of a word line is inputted and outputted to and from a plurality of second memory cells C2 or a plurality of redundancy memory cells RC. The transfer control unit 940 transfers the column signal SELF_YI as the normal column signal NCOL when the redundancy signal RED is deactivated. Accordingly, when the redundancy signal RED is deactivated, the normal column signal NCOL is activated when the first transfer signal SELF_RD or the second transfer signal SELF_WT is activated. Moreover, the transfer control unit 940 transfers the column signal SELF_YI as the redundancy column signal RCOL when the redundancy signal RED is activated. Accordingly, if the redundancy signal RED is activated, the redundancy column signal RCOL is activated when the first transfer signal SELF_RD or the second transfer signal SELF_WT is activated.

The first transfer unit 910 transfers the value RD_OUT<0:B> outputted from a plurality of second memory cells C2 or a plurality of redundancy memory cells RC, which are connected to an activated word line, as the signal UP_IN<0:B> of the input terminal of the adding unit 920 when the first transfer signal SELF_RD is activated. In detail, the first transfer unit 910 transfers the value RD_OUT<0:B> outputted from a plurality of second memory cells C2 or a plurality of redundancy memory cells RC, which are connected to an activated word line, as the signal UP_IN<0:B> of the input terminal of the adding unit 920, based on the period signal SELF_WTS and the column signal SELF_YI. The first transfer unit 910 transfers the value RD_OUT<0:B> outputted from a plurality of second memory cells C2 or a plurality of redundancy memory cells RC, which are connected to an activated word line, as the signal UP_IN<0:B> of the input terminal of the adding unit 920, if the column signal SELF_YI is activated when the period signal SELF_WTS is deactivated.

The adding unit 920 generates the value UP_OUT<0:B> by adding the predetermined value to the value of the signal UP_IN<0:B>, which is inputted to the input terminal thereof, and outputs the value UP_OUT<0:B> through the output terminal thereof. The adding unit 920 may be an adder generally known in the art, which generates a value by adding '1' to an inputted value.

The second transfer unit 930 transfers the value (that is, the increased value) UP_OUT<0:B> outputted through the output terminal of the adding unit 920, as the value WT_IN<0:B>, or initializes the value WT_IN<0:B>, when the second transfer signal SELF_WT is activated. The second transfer unit 930 transfers the value UP_OUT<0:B> increased by the adding unit 920, as the value WT_IN<0:B> if the column signal SELF_YI is activated when the period signal SELF_WTS is activated when both signals REFPW and TRREN described above with reference to FIG. 8 are deactivated. Conversely, the second transfer unit 930 initializes the value WT_IN<0:B> when the column signal SELF_YI is activated when the period signal SELF_WTS is activated when one of the two signals REFPW and TRREN is activated.

The memory core circuit in accordance with the embodiment of the present invention will be described below with reference back to FIG. 8.

Referring to FIG. 8, the memory core circuit includes the first cell array CA1 including the plurality of first memory cells C1, which are connected to the first to $N^{th}$ word lines WL1 to WLN, the second cell array CA2 including the plurality of second memory cells BL2, which are connected to the first to $N^{th}$ word lines WL1 to WLN and are connected to one or more bit lines BL2 and store the numbers of activations of word lines connected to them among the first to $N^{th}$ word lines WL1 to WLN, and the redundancy cell array RCA including the plurality of redundancy memory cells RC, which are connected to the first to $N^{th}$ word lines WL1 to WLN, are connected to one or more redundancy bit lines RBL for replacing one or more bit lines BL2 and store the numbers of activations of word lines connected to them among the first to $N^{th}$ word lines WL1 to WLN when the one or more bit lines BL2 are replaced.

As described above with reference to FIGS. 3 and 4, the memory core circuit increases a value stored in a plurality of second memory cells C2, which are connected to a word line activated among the first to $N^{th}$ word lines WL1 to WLN when the active command ACT is supplied, and increases a value stored in a plurality of redundancy memory cells RC, which are connected to the activated word line when at least one bit line BL2 is replaced.

As described above with reference to FIGS. 3 and 4, the memory core circuit initializes a value stored in a plurality of second memory cells C2, which are connected to a word line activated among the first to $N^{th}$ word lines WL1 to WLN in the case where the normal refresh operation is performed, and initializes a value stored in a plurality of redundancy memory cells RC, which are connected to the activated word line when at least one bit line BL2 is replaced.

As described above with reference to FIGS. 3 and 4, the memory core circuit initializes a value stored in a plurality of second memory cells C2, which are connected to a word line activated among the first to $N^{th}$ word lines WL1 to WLN when the special refresh operation is performed, and initializes a value stored in a plurality of redundancy memory cells RC, which are connected to the activated word line when at least one bit line BL2 is replaced.

In the memory core circuit in accordance with the embodiment of the present invention, the number of activations of a word line is stored using memory cells, which are connected to the corresponding word line. At this time, if a fail occurs in the memory cells for storing the number of activations of the word line or in a bit line with which the memory cells are connected, a special refresh operation may not be properly performed. Accordingly, the memory core circuit in accordance with the embodiment of the present invention has bit lines and memory cells for storing the numbers of activation of word lines and redundancy bit lines and redundancy memory cells for replacing bit lines or memory cells in which fails occur, such that a bit line determined through a test to have a fail is replaced with a redundancy bit line and the number of activations of a word line is stored in redundancy memory cells, whereby the special refresh operation may be smoothly performed.

Although various embodiments have been described for illustrative purposes, it will be apparent to those skilled in the art that various changes and modifications may be made without departing from the spirit and scope of the invention as defined in the following claims.

What is claimed is:

1. A memory comprising:
a first cell array including a plurality of first memory cells connected to a plurality of word lines;
a bit line selection unit configured to select one or more bit lines among a plurality of bit lines based on repair information;
a second cell array including a plurality of second memory cells connected to the plurality of word lines and the plurality of bit lines, wherein a group of the plurality of second memory cells connected to a corresponding word line stores the number of activations of the corresponding word line when the one or more connected bit lines are selected; and
an activation number update unit configured to update a value stored in the second memory cells, which are connected to the one or more selected bit lines and the activated word line among the plurality of word lines.

2. The memory according to claim 1, wherein the bit line selection unit transfers a value outputted from the one or more selected bit lines, which are selected in response to the repair information, to the activation number update unit, and transfers a value outputted from the activation number update unit to the one or more selected bit lines.

3. The memory according to claim 1, wherein the activation number update unit increases a value stored in the second memory cells, which are connected to the one or more selected bit lines and the activated word line, in response to an active command.

4. The memory according to claim 1, wherein the activation number update unit initializes the value stored in the second memory cells, which are connected to the one or more selected bit lines and the activated word line, when a normal refresh operation or a special refresh operation is performed.

5. The memory according to claim 1, further comprising:
an alert signal generation unit configured to activate an alert signal when the number of activations of the word line, which is stored in the second memory cells connected to the one or more selected bit lines and the activated word line, is equal to or greater than a reference number.

6. The memory according to claim 5, further comprising:
an address storage unit configured to store an address corresponding to the activated word line when the alert signal is activated.

7. A memory comprising:
a first cell array including a plurality of first memory cells connected to a plurality of word lines;
a second cell array including a plurality of second memory cells connected to the plurality of word lines and one or more bit lines, wherein a group of the plurality of second memory cells connected to a corresponding word line stores the number of activations of the corresponding word line;
a redundancy cell array including a plurality of redundancy memory cells connected to the plurality of word lines and one or more redundancy bit lines for replacing the one or more bit lines, wherein a group of the plurality of redundancy memory cells connected to a corresponding word line stores the number of activations of the corresponding word line when the one or more bit lines are replaced; and
an activation number update unit configured to update a value stored in the second memory cells connected to the activated word line, and update a value stored in the redundancy memory cells connected to the activated word line when the one or more bit lines are replaced.

8. The memory according to claim 7, wherein, when an active command is supplied, the activation number update unit increases a value stored in the second memory cells connected to the activated word line, and increases a value stored in the redundancy memory cells connected to the activated word line when the one or more bit lines are replaced.

9. The memory according to claim 7, wherein, when a normal refresh operation or a special refresh operation is performed, the activation number update unit initializes the value stored in the second memory cells connected to the activated word line, and initializes the value stored in the redundancy memory cells connected to the activated word line when the one or more bit lines are replaced.

10. The memory according to claim 7, further comprising:
an alert signal generation unit configured to activate an alert signal when the number of activations of the word line, which is stored in the second memory cells connected to the activated word line or in the redundancy memory cells connected to the activated word line, is equal to or greater than a reference number.

11. The memory according to claim 10, further comprising:
an address storage unit configured to store an address corresponding to the activated word line when the alert signal is activated.

12. The memory according to claim 7, wherein the activation number update unit activates one column signal of a normal column signal and a redundancy column signal in response to a redundancy signal, and
wherein the value stored in the second memory cells connected to the activated word line is updated when the normal column signal is activated, and the value stored in the redundancy memory cells connected to the activated word line is updated when the redundancy column signal is activated.

* * * * *